(12) United States Patent
Woo et al.

(10) Patent No.: US 11,755,234 B2
(45) Date of Patent: Sep. 12, 2023

(54) METHOD OF GENERATING SIGNAL FOR TEST IN MEMORY DEVICE USING MULTI-LEVEL SIGNALING AND MEMORY DEVICE PERFORMING THE SAME

(71) Applicant: Samsung Electronics Co., Ltd., Suwon-si (KR)

(72) Inventors: Byungsuk Woo, Hwaseong-si (KR); Younguk Chang, Suwon-si (KR); Yongho Cho, Seongnam-si (KR)

(73) Assignee: Samsung Electronics Co., Ltd.

( * ) Notice: Subject to any disclaimer, the term of this patent is extended or adjusted under 35 U.S.C. 154(b) by 28 days.

(21) Appl. No.: 17/394,488

(22) Filed: Aug. 5, 2021

(65) Prior Publication Data

US 2022/0121388 A1    Apr. 21, 2022

(30) Foreign Application Priority Data

Oct. 16, 2020  (KR) .......................... 10-2020-0133851

(51) Int. Cl.
*G06F 3/06* (2006.01)

(52) U.S. Cl.
CPC .......... *G06F 3/0653* (2013.01); *G06F 3/0604* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 7,162,672 B2 | 1/2007 | Werner et al. | |
| 8,982,938 B2 | 3/2015 | Ran | |
| 9,998,306 B2 | 6/2018 | Navid | |
| 10,164,808 B2 | 12/2018 | Schnizler | |
| 10,164,817 B2 | 12/2018 | Hollis et al. | |
| 10,446,198 B2 | 10/2019 | Hasbun et al. | |
| 2014/0016404 A1* | 1/2014 | Kim | G11C 11/165 365/158 |
| 2015/0187441 A1* | 7/2015 | Hollis | G11C 29/1201 714/719 |
| 2015/0364176 A1* | 12/2015 | Lee | G11C 29/023 365/230.06 |
| 2019/0296888 A1* | 9/2019 | Kobayashi | H03L 7/0807 |
| 2019/0363914 A1 | 11/2019 | Hayashi et al. | |
| 2020/0185049 A1 | 6/2020 | Spirkl et al. | |

* cited by examiner

*Primary Examiner* — Sanjiv Shah
*Assistant Examiner* — Alexander J Yoon
(74) *Attorney, Agent, or Firm* — Myers Bigel, P.A.

(57) ABSTRACT

In a method of generating a signal for test in a memory device configured to output a multi-level signal, an operation mode is set to a first test mode. During the first test mode, first data bits included in a plurality of test data are arranged based on a first scheme. Each of the plurality of test data includes two or more data bits. During the first test mode, a first test result signal having two voltage levels is generated based on the first data bits according to the first scheme. The operation mode is set to a second test mode during which second data bits included in the plurality of test data are arranged based on a second scheme. During the second test mode, a second test result signal having the two voltage levels is generated based on the second data bits according to the second scheme.

17 Claims, 30 Drawing Sheets

FIG. 13

| | CASE1 | | | | CASE2 | | | |
|---|---|---|---|---|---|---|---|---|
| | BL0 | | BL1 | | BL0 | | BL1 | |
| | MSB | LSB | MSB | LSB | MSB | LSB | MSB | LSB |
| TRS11 (=MD_EVEN) | 0 | 0 | 1 | 0 | 0 | 1 | 1 | 0 |
| TRS21 (=MD_ODD) | 1 | 0 | 1 | 1 | 1 | 0 | 1 | 0 |

FIG. 22

|  | CASE1 | | | | CASE2 | | | |
|---|---|---|---|---|---|---|---|---|
|  | BL0 | | BL1 | | BL0 | | BL1 | |
|  | MSB | LSB | MSB | LSB | MSB | LSB | MSB | LSB |
| TRS12 (=MD_MSB) | 0 | 0 | 1 | 1 | 0 | 1 | 1 | 0 |
| TRS22 (=MD_LSB) | 0 | 0 | 1 | 1 | 1 | 1 | 0 | 0 |

METHOD OF GENERATING SIGNAL FOR TEST IN MEMORY DEVICE USING MULTI-LEVEL SIGNALING AND MEMORY DEVICE PERFORMING THE SAME

CROSS-REFERENCE TO RELATED APPLICATION

This application claims priority under 35 USC § 119 to Korean Patent Application No. 10-2020-0133851 filed on Oct. 16, 2020 in the Korean Intellectual Property Office (KIPO), the contents of which are herein incorporated by reference in their entirety.

BACKGROUND

Example embodiments relate generally to semiconductor integrated circuits, and more particularly to methods of generating signals for test in memory devices using multi-level signaling, and memory devices performing the methods of generating signals for test.

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered.

Recently, as the performance of the semiconductor memory device is improved, a high communication speed (or interface speed) may be needed between a memory controller and the semiconductor memory device. Thus, a multi-level signaling in which a plurality of bits are transmitted during one unit interval (UI) has been researched.

SUMMARY

At least one example embodiment of the present disclosure provides a method of generating a signal for test in a memory device that operates based on a multi-level signaling scheme.

At least one example embodiment of the present disclosure provides a memory device that performs the method of generating the signal for test.

According to example embodiments, in a method of generating a signal for test in a memory device, the memory device is configured to output a multi-level signal having three or more voltage levels that are different from each other. An operation mode of the memory device is set to a first test mode based on a command signal. During the first test mode, first data bits included in a plurality of test data are arranged based on a first scheme. The first data bits are obtained by reading the plurality of test data stored in the memory device. Each of the plurality of test data includes two or more data bits. During the first test mode, a first test result signal is generated based on the first data bits according to the first scheme. The first test result signal has two voltage levels that are different from each other. The operation mode is set to a second test mode based on the command signal. The second test mode is different from the first test mode. During the second test mode, second data bits included in the plurality of test data are arranged based on a second scheme different from the first scheme. The second data bits are different from the first data bits and are obtained by reading the plurality of test data. During the second test mode, a second test result signal is generated based on the second data bits according to the second scheme. The second test result signal has the two voltage levels that are different from each other.

According to example embodiments, a memory device configured to output a multi-level signal having three or more voltage levels that are different from each other includes a memory core, a memory register sets, a data arrangement circuit and an output circuit. The memory core is configured to store a plurality of test data each of which includes two or more data bits. The memory register set is configured to set an operation mode of the memory device to one of a first test mode and a second test mode based on a command signal. The first and second test modes are different from each other. The data arrangement circuit arranges first data bits included in the plurality of test data based on a first scheme during the first test mode, and arranges second data bits included in the plurality of test data based on a second scheme during the second test mode. The first and second data bits are different from each other and are obtained by reading the plurality of test data. The first and second schemes are different from each other. The output circuit generates a first test result signal based on the first data bits according to the first scheme during the first test mode, and generates a second test result signal based on the second data bits according to the second scheme during the second test mode. Each of the first and second test result signals has two voltage levels that are different from each other.

According to example embodiments, in a method of generating a signal for test in a memory device, the memory device is configured to output a pulse amplitude modulation four (PAM4) signal having four voltage levels that are different from each other. An operation mode of the memory device is set to a first test mode based on a command signal. During the first test mode, a plurality of test data stored in the memory device are read. Each of the plurality of test data includes two or more data bits. During the first test mode, most significant bits (MSBs) included in the plurality of test data or data bits included in even-numbered test data among the plurality of test data are repetitively arranged based on a first scheme. During the first test mode, a first test result signal is generated based on the MSBs of the plurality of test data or the data bits of the even-numbered test data that are repetitively arranged based on the first scheme. The first test result signal is a two-level signal having two voltage levels that are different from each other. The operation mode is set to a second test mode based on the command signal. The second test mode is different from the first test mode. During the second test mode, the plurality of test data are read. During the second test mode, least significant bits (LSBs) included in the plurality of test data or data bits included in odd-numbered test data among the plurality of test data are repetitively arranged based on a second scheme different from the first scheme. During the second test mode, a second test result signal is generated based on the LSBs of the plurality of test data or the data bits of the odd-numbered test data that are repetitively arranged based on the second scheme. The second test result signal is the two-level signal having the two voltage levels that are different from each other. The first and second test result signals include information of all data bits included in the plurality of test data.

In the method of generating the signal for test and the memory device according to example embodiments, the first and second test result signals that are the two-level signals may be generated and output based on the plurality of test data that are the multi-bit data during the test mode. Accordingly, the memory device operating based on the multi-level signaling scheme may be tested using an existing test equipment that receives the two-level signal, and thus a test cost may be reduced. In addition, the two-level signal having a better signal-to-noise ratio (SNR) than the multi-level signal may be used to test the memory device, and thus a larger number of memory devices may be tested at the same time.

BRIEF DESCRIPTION OF THE DRAWINGS

Illustrative, non-limiting example embodiments will be more clearly understood from the following detailed description taken in conjunction with the accompanying drawings.

FIG. 13 is a table illustrating an example of a result in a first test mode of FIGS. 7 and 8 and a result in a second test mode of FIGS. 10 and 11.

FIG. 22 is a table illustrating an example of a result in a first test mode of FIGS. 16 and 17 and a result in a second test mode of FIGS. 19 and 20.

DETAILED DESCRIPTION

Figure 1:
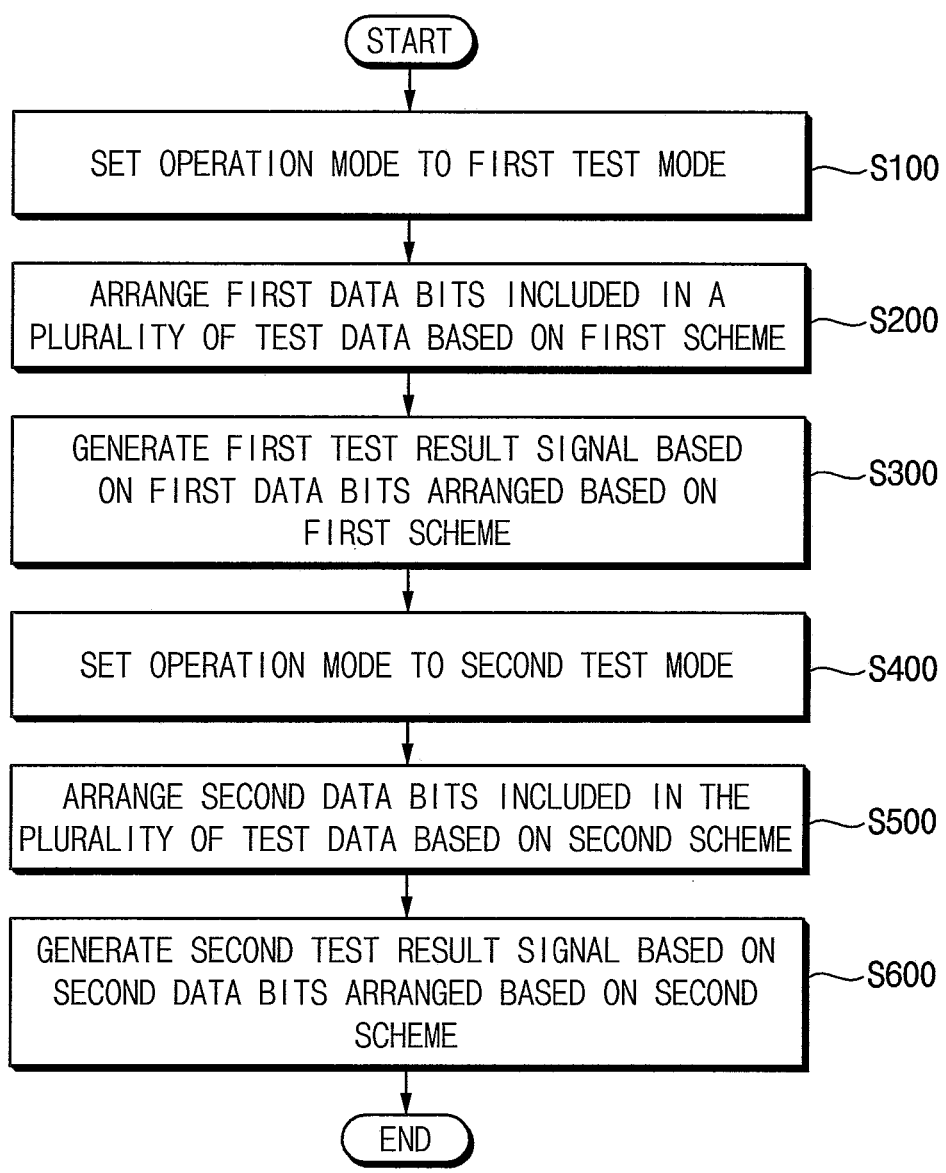
FIG. 1 is a flowchart illustrating a method of generating a signal for test according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of generating a signal for test according to example embodiments.

Referring to FIG. 1, a method of generating a signal for test, according to example embodiments, is performed by a memory device that is configured to output a multi-level signal, and is performed during a test mode in which the memory device is tested. The multi-level signal has three or more voltage levels that are different from each other. For example, the multi-level signal may have one of the three or more voltage levels during one unit interval (UI). A configuration of the memory device will be described with reference to FIGS. 2 and 3, and the multi-level signal will be described with reference to FIG. 4A.

In the method of generating the signal for test according to example embodiments, an operation mode of the memory device is set to a first test mode based on a command signal (step S100). For example, the command signal may include a first command for setting and/or enabling a test mode, and a second command (e.g., a read command) for outputting a test result signal corresponding to test data.

During the first test mode, first data bits included in a plurality of test data are arranged based on a first scheme (step S200). The first data bits are obtained by reading the plurality of test data stored in the memory device. Each of the plurality of test data includes two or more data bits. In other words, each of the plurality of test data may be multi-bit data. For example, the first data bits may be some or a part of data bits included in multi-bit data. For example, the plurality of test data may be provided from an external test equipment and may be stored in the memory device.

During the first test mode, a first test result signal is generated based on the first data bits arranged based on the first scheme (step S300). The first test result signal has two voltage levels that are different from each other. In other words, the first test result signal may be a two-level signal. For example, the first test result signal may have one of the two voltage levels during one UI. For example, the first test result signal may be generated based on a non-return-to-zero (NRZ) scheme.

The operation mode is set to a second test mode based on the command signal (step S400). The second test mode is different from the first test mode.

During the second test mode, second data bits included in the plurality of test data are arranged based on a second scheme (step S500). The second data bits are different from the first data bits and are obtained by reading the plurality of test data. For example, the second data bits may be the other or another part of data bits included in multi-bit data. The second scheme is different from the first scheme. Detailed schemes of arranging data bits will be described later.

During the second test mode, a second test result signal is generated based on the second data bits arranged based on the second scheme (step S600). As with the first test result signal, the second test result signal has the two voltage levels that are different from each other.

All data bits included in the plurality of test data may be obtained based on the first and second test result signals.

In the memory device, according to example embodiments, a data signal is generated and/or transmitted based on a multi-level signaling scheme. The multi-level signaling scheme may be used for compressing the bandwidth required to transmit data at a given bit rate. In a simple binary scheme, two single symbols, usually two voltage levels, may be used to represent '1' and '0,' and thus the symbol rate may be equal to the bit rate. In contrast, the principle of the multi-level signaling scheme may be to use a larger alphabet of m symbols to represent data, so that each symbol may represent more than one bit of data. As a result, the number of symbols that need to be transmitted may be less than the number of bits (e.g., the symbol rate may be less than the bit rate), and thus the bandwidth may be compressed. The alphabet of symbols may be constructed from a number of different voltage levels. For example, in a four-level scheme, groups of two data bits may be mapped to one of four symbols. Only one symbol need be transmitted for each pair of data bits, so the symbol rate may be a half of the bit rate.

In other words, the multi-level signaling scheme may be used to increase a data transmission (or transfer) rate without increasing the frequency of data transmission and/or a transmission power of the communicated data. An example of one type of the multi-level signaling scheme may be a pulse amplitude modulation (PAM) scheme, where a unique symbol of a multi-level signal may represent a plurality of bits of data. The number of possible pulse amplitudes in a digital PAM scheme may be some power of two. For example, there may be $2^2$ possible discrete pulse amplitudes in a 4-level PAM (e.g., in PAM4), there may be $2^3$ possible discrete pulse amplitudes in an 8-level PAM (e.g., in PAM8), and there may be $2^4$ possible discrete pulse amplitudes in a 16-level PAM (e.g., in PAM16). However, example embodiments are not limited thereto, and example embodiments may be applied or employed to an X-level PAM (e.g., PAM(X)) having X possible pulse amplitudes, where X is a natural number greater than or equal to three. X may be a power of two.

In the method of generating the signal for test according to example embodiments, the first and second test result signals that are two-level signals may be generated and output based on the plurality of test data that are the multi-bit data during the test mode. Accordingly, the memory device operating based on the multi-level signaling scheme may be tested using an existing test equipment that receives the two-level signal, and thus the testing cost may be reduced. In addition, the two-level signal, which has a better signal-to-noise ratio (SNR) than the multi-level signal, may be used to test the memory device. Thus a larger number of memory devices may be tested at the same time.

Figure 2:
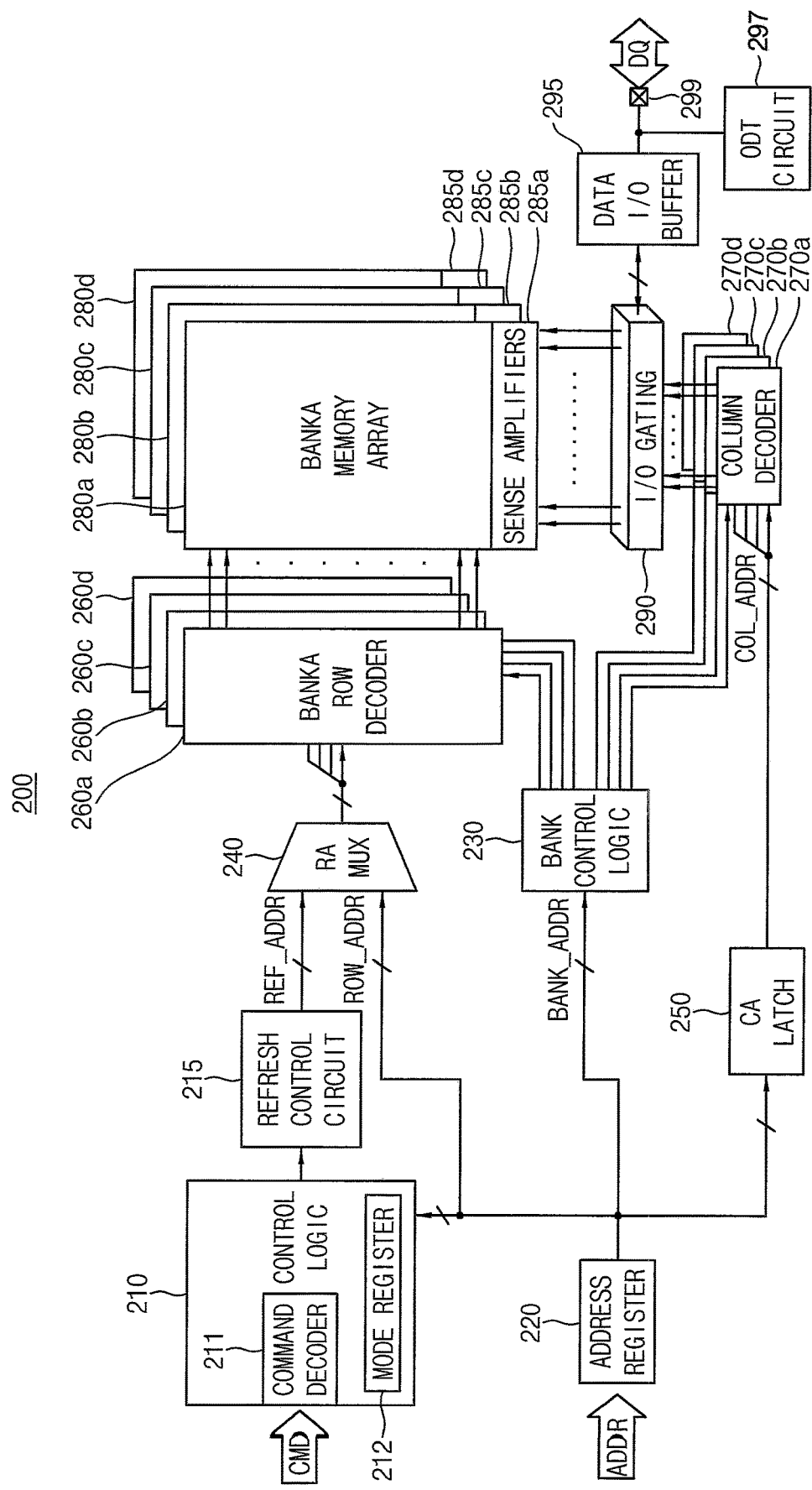
FIG. 2 is a block diagram illustrating an example of a memory device according to example embodiments.

FIG. 2 is a block diagram illustrating an example of a memory device according to example embodiments.

Referring to FIG. 2, a memory device 200 includes a control logic circuit 210, a refresh control circuit 215, an address register 220, a bank control logic circuit 230, a row address multiplexer 240, a column address latch 250, a row decoder, a column decoder, a memory cell array, a sense amplifier unit, an input/output (I/O) gating circuit 290, a data I/O buffer 295, an on-die termination (ODT) circuit 297 and a data I/O pad 299. A person of ordinary skill in the art should understand and appreciate that the inventive concept is not limited to the quantities of components shown and described in FIG. 2.

In some example embodiments, the memory device 200 may be a volatile memory device. For example, the memory device 200 may be one of various volatile memory devices such as a dynamic random access memory (DRAM), a mobile DRAM, a dual data rate (DDR) DRAM, a low power DDR (LPDDR) DRAM, a graphic DDR (GDDR) DRAM, or the like.

The memory cell array includes a plurality of memory cells. The memory cell array may include a plurality of bank arrays, e.g., first through fourth bank arrays 280*a*, 280*b*, 280*c* and 280*d*. The row decoder may include a plurality of bank row decoders, e.g., first through fourth bank row decoders 260*a*, 260*b*, 260*c* and 260*d* connected to the first through fourth bank arrays 280*a*, 280*b*, 280*c* and 280*d*, respectively. The column decoder may include a plurality of bank column decoders, e.g., first through fourth bank column decoders 270*a*, 270*b*, 270*c* and 270*d* connected to the first through fourth bank arrays 280*a*, 280*b*, 280*c* and 280*d*, respectively. The sense amplifier unit may include a plurality of bank sense amplifiers, e.g., first through fourth bank sense amplifiers 285*a*, 285*b*, 285*c* and 285*d* connected to the first through fourth bank arrays 280*a*, 280*b*, 280*c* and 280*d*, respectively.

The first through fourth bank arrays 280*a* through 280*d*, the first through fourth bank row decoders 260*a* through 260*d*, the first through fourth bank column decoders 270*a* through 270*d*, and the first through fourth bank sense amplifiers 285*a* through 285*d* may form first through fourth banks, respectively. For example, the first bank array 280*a*, the first bank row decoder 260*a*, the first bank column decoder 270*a*, and the first bank sense amplifier 285*a* may form the first bank; the second bank array 280*b*, the second bank row decoder 260*b*, the second bank column decoder 270*b*, and the second bank sense amplifier 285*b* may form the second bank; the third bank array 280*c*, the third bank row decoder 260*c*, the third bank column decoder 270*c*, and the third bank sense amplifier 285*c* may form the third bank; and the fourth bank array 280*d*, the fourth bank row decoder 260*d*, the fourth bank column decoder 270*d*, and the fourth bank sense amplifier 285*d* may form the fourth bank. Although FIG. 2 illustrates the memory device 200 including four banks, in other example embodiments, the memory device 200 may include any number of banks. Nor is there a requirement that the components shown in FIG. 2 in quantities of four have a one-to-one correspondence with each other. In other words, there could be more or less decoders or sensors than shown in FIG. 2.

Figure 27:
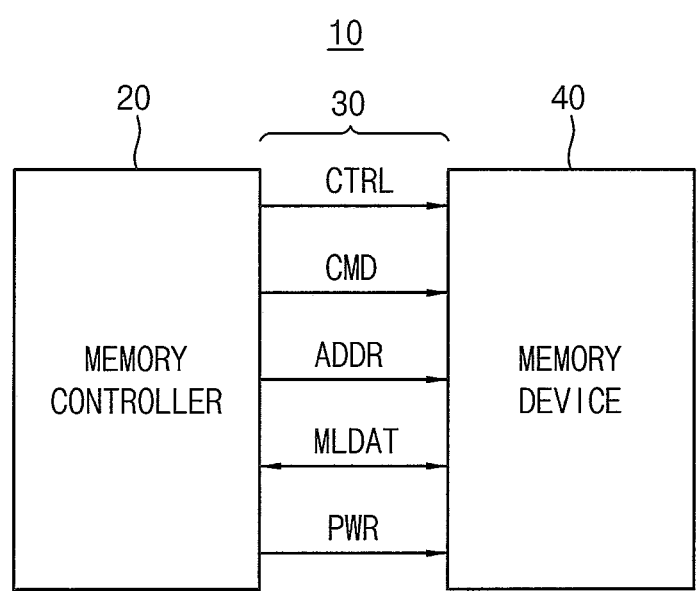
FIG. 27 is a block diagram illustrating a memory system according to example embodiments.

The address register 220 may receive an address ADDR including a bank address BANK_ADDR, a row address ROW_ADDR and/or a column address COL_ADDR from a memory controller (e.g., a memory controller 20 in FIG. 27). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to receipt of the bank address BANK_ADDR. One of the first through fourth bank row decoders 260a through 260d corresponding to the received bank address BANK_ADDR may be activated in response to the bank control signals generated by the bank control logic circuit 230, and one of the first through fourth bank column decoders 270a through 270d corresponding to the received bank address BANK_ADDR may be activated in response to the bank control signals generated by the bank control logic circuit 230.

The refresh control circuit 215 may generate a refresh address REF_ADDR in response to receipt of a refresh command or entrance of a self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic circuit 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a through 260d.

The activated one of the first through fourth bank row decoders 260a through 260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a through 270d.

The activated one of the first through fourth bank column decoders 270a through 270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, although not shown, the I/O gating circuit 290 may include an input data mask logic, read data latches for storing data output from the first through fourth bank arrays 280a through 280d, and write drivers for writing data to the first through fourth bank arrays 280a through 280d.

Data DQ to be read from one of the first through fourth bank arrays 280a through 280d may be sensed by a sense amplifier coupled to the one bank array, and may be stored in the read data latches of the I/O gating circuit 290. The data DQ stored in the read data latches may be provided to the memory controller via the data I/O buffer 295 and the data I/O pad 299. Data DQ received via the data I/O pad 299 that are to be written to one of the first through fourth bank arrays 280a~280d may be provided from the memory controller to the data I/O buffer 295. The data DQ received via the data I/O pad 299 and provided to the data I/O buffer 295 may be written to the one bank array via the write drivers in the I/O gating circuit 290.

The control logic circuit 210 may control an operation of the memory device 200. For example, the control logic circuit 210 may generate control signals for the memory device 200 to perform a data write operation or a data read operation. The control logic circuit 210 may include a command decoder 211 that decodes a command CMD received from the memory controller and a mode register 212 that sets an operation mode of the memory device 200. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The control logic circuit 210 may further receive a clock signal (e.g., CLK) and a clock enable signal (e.g., /CKE) for operating the memory device 200 in a synchronous manner.

The ODT circuit 297 may be connected to the data I/O pad 299 and the data I/O buffer 295. When the ODT circuit 297 is enabled, an ODT operation may be performed. The ODT operation may reduce (and/or prevent) a signal from being reflected by using a termination resistor so as to improve signal integrity.

Although the memory device according to example embodiments is described based on a DRAM, the memory device according to example embodiments may be any volatile memory device, and/or any nonvolatile memory device, e.g., a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 3:
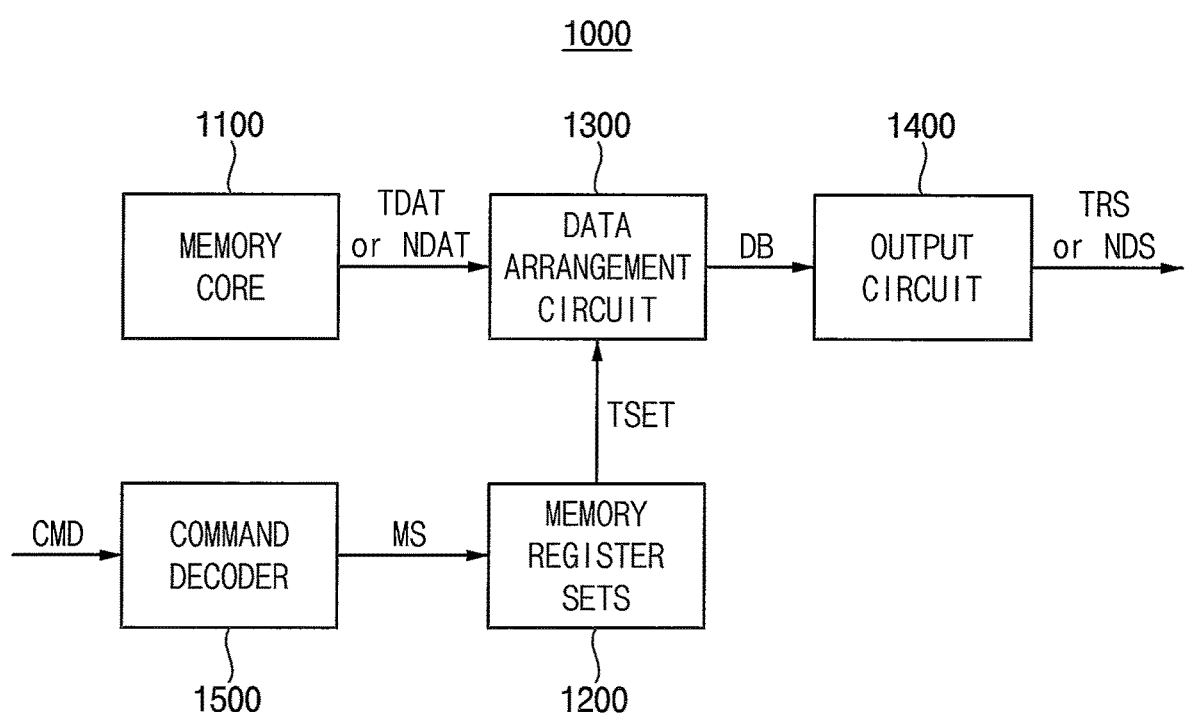
FIG. 3 is a block diagram illustrating a memory device according to example embodiments.

FIG. 3 is a block diagram illustrating a memory device according to example embodiments.

Referring to FIG. 3, a memory device 1000 includes a memory core 1100, a memory register sets 1200, a data arrangement circuit 1300 and an output circuit 1400. The memory device 1000 may further include a command decoder 1500.

In some example embodiments, the memory device 1000 may operate based on a multi-level signaling scheme and may be a DRAM.

The memory core 1100 stores a plurality of test data TDAT. Each of the plurality of test data TDAT may be multi-bit data including two or more data bits. The plurality of test data TDAT may be read during a test mode in which the memory device 1000 is tested. For example, the memory core 1100 may include the memory cell array, the sense amplifier unit, etc. in FIG. 2.

The command decoder 1500 may generate a mode setting signal MS by decoding a command signal CMD. The command decoder 1500 may correspond to the command decoder 211 in FIG. 2.

The memory register sets 1200 sets an operation mode of the memory device 1000 to one of different test modes based on the command signal CMD (e.g., based on the mode setting signal MS generated based on the command signal CMD). The memory register sets 1200 may generate a setting signal TSET for setting the different test modes. For example, the memory register sets 1200 may perform steps S100 and/or S400 in FIG. 1.

The data arrangement circuit 1300 reads different data bits DB included in the plurality of test data TDAT during the different test modes, and arranges the different data bits DB based on different schemes. For example, the data arrangement circuit 1300 may be included in the I/O gating circuit 290 and/or the data I/O buffer 295 in FIG. 2. For example, the data arrangement circuit 1300 may perform steps S200 and S500 in FIG. 1.

The output circuit 1400 generates test result signals TRS having two voltage levels that are different from each other, based on the different data bits DB arranged based on the different schemes during the different test modes. For example, the output circuit 1400 may be included in the data I/O buffer 295 in FIG. 2. For example, the output circuit 1400 may perform steps S300 and/or S600 in FIG. 1. The test result signals TRS may be provided to an external test equipment and may be used to test the memory device 1000.

Although an operation of the memory device 1000 during the test mode is described, the memory device 1000 may operate during a normal mode other than the test mode. For example, the memory core 1100 may store a plurality of normal data NDAT, the memory register sets 1200 may set the operation mode to the normal mode based on the command signal CMD, the data arrangement circuit 1300 may read data bits DB included in the plurality of normal data NDAT during the normal mode and may arrange the data bits DB based on a third scheme, and the output circuit 1400 may generate a normal data signal NDS based on an output of the data arrangement circuit 1300 during the normal mode. Each of the plurality of normal data NDAT may include two or more data bits, the third scheme may be different from the first and second schemes, and the normal data signal NDS may have three or more voltage levels that are different from each other. The plurality of normal data NDAT and the normal data signal NDS may correspond to read data (e.g., user data), and may be provided to an external memory controller during the normal mode.

Although not illustrated in FIG. 3, the memory device 1000 may further include a data I/O pin for outputting the test result signals TRS or the normal data signal NDS, and a command pin for receiving the command signal CMD. For example, each of the data I/O pin and the command pin may be a contact pin or a contact pad, but example embodiments are not limited thereto. The data I/O pin and the command pin may be used in the test mode for injecting signals into or reading signals out of the memory device 1000.

Figure 4A:
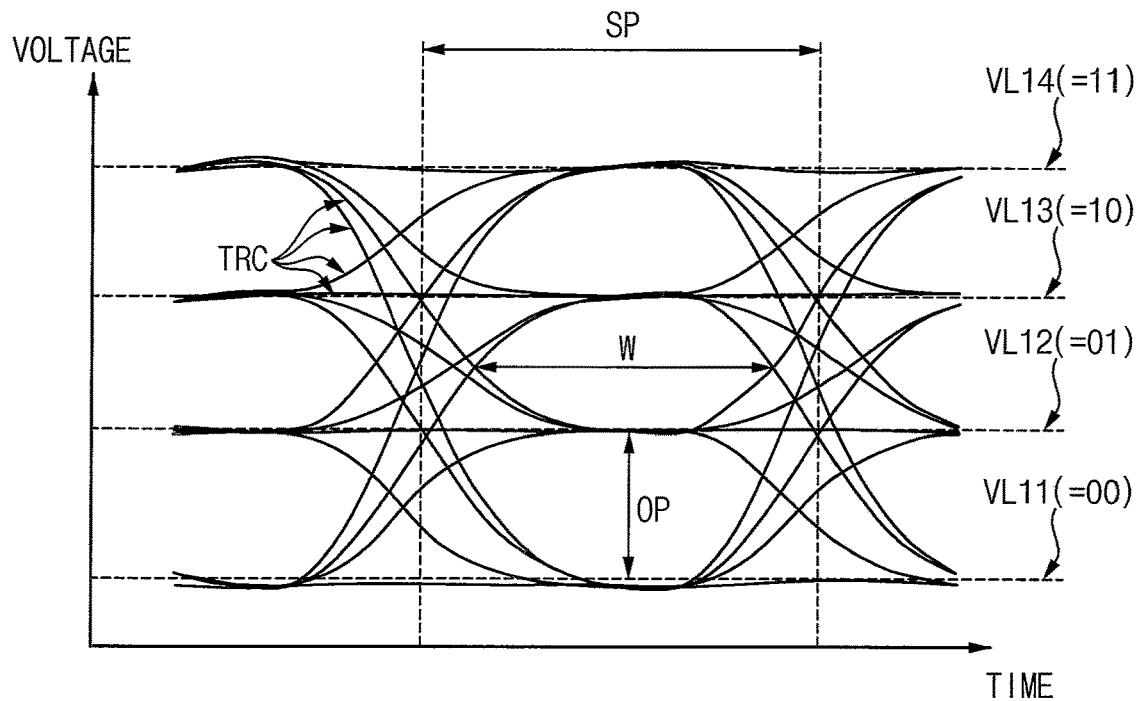
FIGS. 4A and 4B are diagrams for describing a multi-level signal and a two-level signal that are used in a memory device according to example embodiments.
Figure 4B:
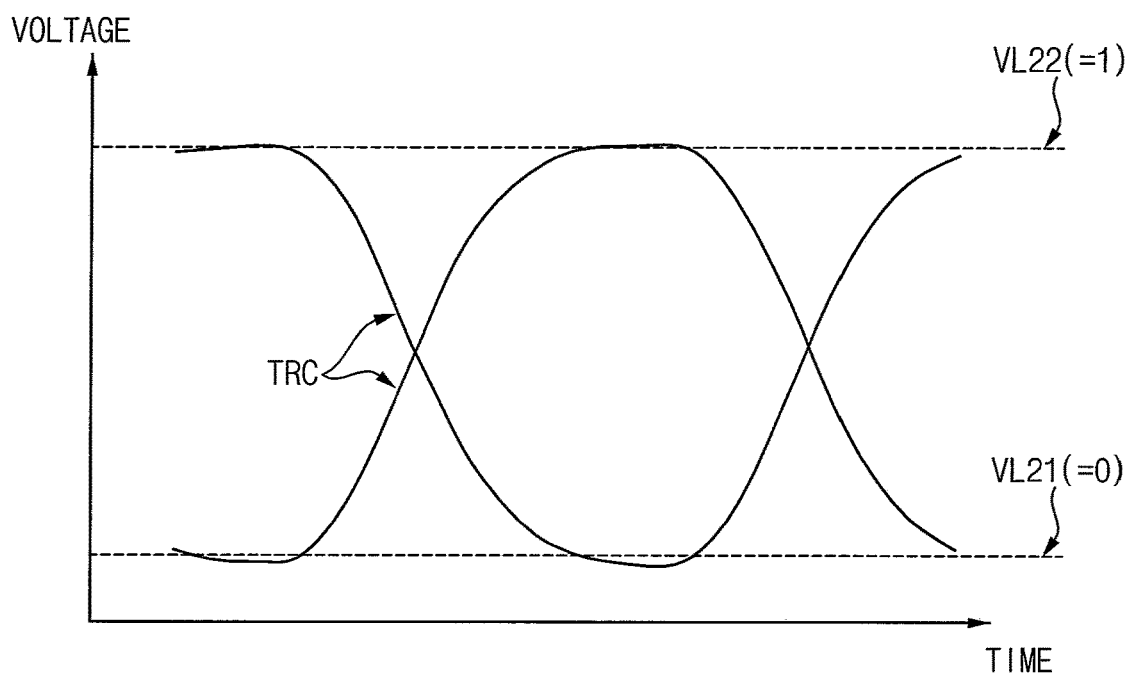

FIGS. 4A and 4B are diagrams for describing a multi-level signal and a two-level signal that are used in a memory device according to example embodiments.

Referring to FIG. 4A, an ideal eye diagram of a data signal (e.g., a PAM4 signal) generated based on the 4-level scheme (e.g., the PAM4 scheme) that is an example of the multi-level signaling scheme (e.g., the PAM scheme) is illustrated. The PAM4 signal in FIG. 4A may be an example of the normal data signal NDS in FIG. 3.

An eye diagram may be used to indicate the quality of signals in high-speed transmissions. For example, the eye diagram in FIG. 4A may represent four symbols of a signal (e.g., '00', '01', '10' and '11'), and each of the four symbols may be represented by a respective one of different voltage levels (e.g., voltage amplitudes) VL11, VL12, VL13 and VL14. The eye diagram may be used to provide a visual indication of the health of the signal integrity, and may indicate noise margins of the data signal.

To generate the eye diagram, an oscilloscope or other computing device may sample a digital signal according to a sample period SP (e.g., a unit interval or a bit period). The sample period SP may be defined by a clock associated with the transmission of the measured signal. The oscilloscope or other computing device may measure the voltage level of the signal during the sample period SP to form the plurality of traces TRC. Various characteristics associated with the measured signal may be determined by overlaying the plurality of traces TRC.

The eye diagram may be used to identify a number of characteristics of a communication signal such as jitter, cross talk, electromagnetic interference (EMI), signal loss, signal-to-noise ratio (SNR), other characteristics, or combinations thereof. For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL11, VL12, VL13 and VL14. The eye opening OP may be related to a voltage margin for discriminating between different voltage levels VL11, VL12, VL13 and VL14 of the measured signal.

Referring to FIG. 4B, an ideal eye diagram of a data signal (e.g., an NRZ signal) generated based on the NRZ scheme, which is an example of the two-level signaling scheme described herein, is illustrated. The NRZ signal in FIG. 4B may be an example of the test result signals TRS in FIG. 3. The descriptions repeated with FIG. 4A will be omitted.

An eye diagram may be used to indicate the quality of signals in high-speed transmissions. For example, the eye diagram in FIG. 4B may represent two symbols of a signal (e.g., '0' and '1'), and each of the two symbols may be represented by a respective one of different voltage levels (e.g., voltage amplitudes) VL21 and VL22.

In some example embodiments, the voltage level VL21, which corresponds to a low voltage level among the voltage levels VL21 and VL22 in FIG. 4B, may be substantially equal to the voltage level VL11, which is the lowest voltage level among the voltage levels VL11, VL12, VL13 and VL14 in FIG. 4A. The voltage level VL22, which corresponds to a high voltage level among the voltage levels VL21 and VL22 in FIG. 4B, may be substantially equal to the voltage level VL14, which is the highest voltage level among the voltage levels VL11, VL12, VL13 and VL14 in FIG. 4A. However, example embodiments are not limited thereto, and the voltage levels VL11, VL12, VL13, VL14, VL21 and/or VL22 may be changed according to example embodiments.

Hereinafter, example embodiments will be described in detail based on the NRZ scheme and the PAM4 scheme, e.g., based on an example where the test result signals TRS and the normal data signal NDS in FIG. 3 are the NRZ signal and the PAM4 signal, respectively. However, example embodiments are not limited thereto, and example embodiments may be applied or employed to the PAM(X) scheme having X possible pulse amplitudes.

Figure 5:
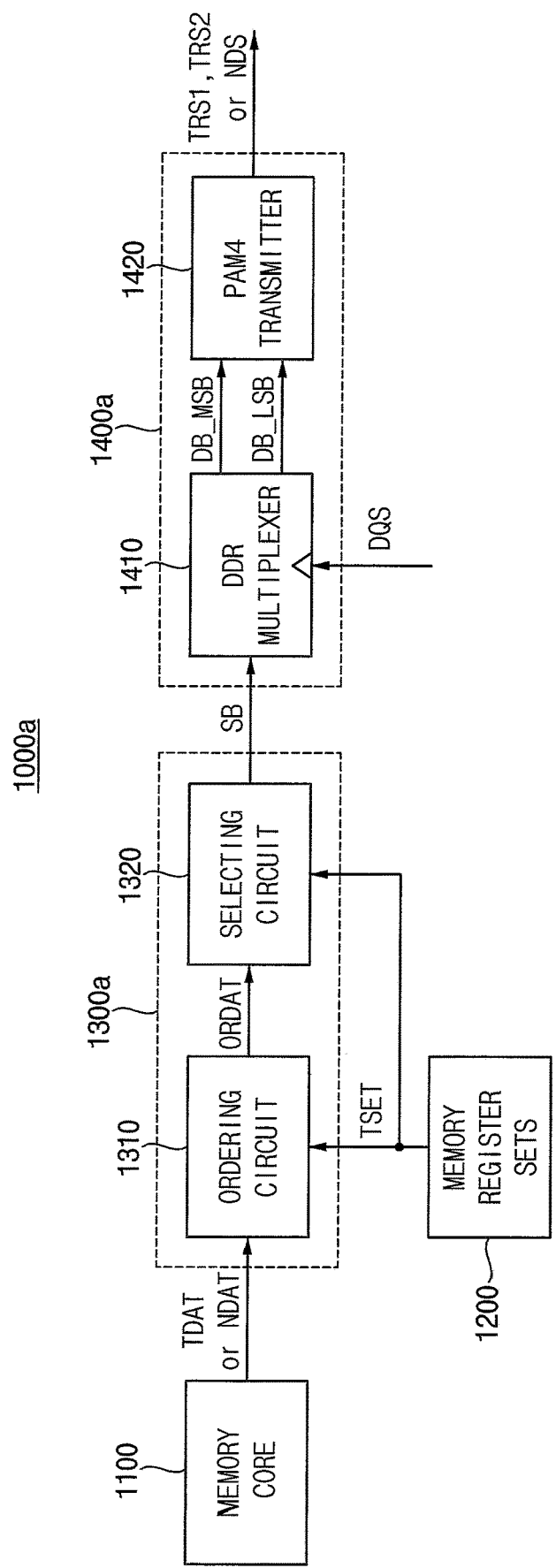
FIG. 5 is a block diagram illustrating an example of a memory device of FIG. 3.

FIG. 5 is a block diagram illustrating an example of a memory device of FIG. 3. The descriptions repeated with FIG. 3 will be omitted.

Referring to FIG. 5, a memory device 1000a includes a memory core 1100, memory register sets 1200, a data arrangement circuit 1300a and an output circuit 1400a. For convenience of illustration, the command decoder 1500 in FIG. 3 is omitted.

The data arrangement circuit 1300a may approximately simultaneously read the plurality of test data TDAT, may arrange the first data bits included in the plurality of test data TDAT based on the first scheme and may output the first data bits arranged based on the first scheme as data bits SB during the first test mode, and may arrange the second data bits included in the plurality of test data TDAT based on the second scheme and may output the second data bits arranged based on the second scheme as data bits SB during the second test mode. The data arrangement circuit 1300a may include an ordering circuit 1310 and a selecting circuit 1320.

The ordering circuit 1310 may change an arrangement order of the plurality of test data TDAT that are approximately simultaneously read based on the setting signal TSET, and may output data ORDAT in which the arrangement order has been changed. The arrangement order may be changed or be different from the arrangement order of the test data TDAT, depending on the test modes set based on the setting signal TSET (e.g., depending on the first and second test modes).

The selecting circuit 1320 may arrange the first data bits based on the first scheme to output the first data bits arranged based on the first scheme during the first test mode, and may arrange the second data bits based on the second scheme to output the second data bits arranged based on the second scheme during the second test mode, based on the setting signal TSET and the data ORDAT that is an output of the ordering circuit 1310. For example, the selecting circuit 1320 may serialize the data ORDAT.

The output circuit 1400a may generate a first test result signal TRS1 based on the first data bits arranged based on the first scheme during the first test mode, and may generate a second test result signal TRS2 based on the second data bits arranged based on the second scheme during the second test mode. The output circuit 1400a may include a multiplexer 1410 and a transmitter 1420.

The multiplexer 1410 may generate first bits DB_MSB and second bits DB_LSB based on a data strobe signal DQS and the data bits SB that are an output of the data arrangement circuit 1300a. For example, the multiplexer 1410 may serialize the data bits SB. For example, the multiplexer 1410 may be a double data rate (DDR) multiplexer that serializes the data bits SB based on a DDR scheme. For example, the first bits DB_MSB may be most significant bits (MSBs) for generating the test result signals TRS1 and TRS2 that are output data signals, and the second bits DB_LSB may be least significant bits (LSBs) for generating the test result signals TRS1 and TRS2.

The transmitter 1420 may generate the first test result signal TRS1 during the first test mode, and may generate the second test result signal TRS2 during the second test mode, based on the first and second bits DB_MSB and DB_LSB. For example, the transmitter 1420 may be a PAM4 transmitter that generates the output data signal having four voltage levels (e.g., the voltage levels VL11, VL12, VL13 and VL14 in FIG. 4A) based on two bits DB_MSB and DB_LSB. The normal data signal NDS generated during the normal mode may include same or all of the four voltage levels (e.g., VL11, VL12, VL13 and VL14). In contrast, each of the test result signals TRS1 and TRS2 generated during the test mode may have two (e.g., VL11 and VL14) of the four voltage levels. As a result, each of the test result signals TRS1 and TRS2 may be provided as a two-level signal including two voltage levels (e.g., VL21 and VL22), as illustrated in FIG. 4B.

Figure 6:
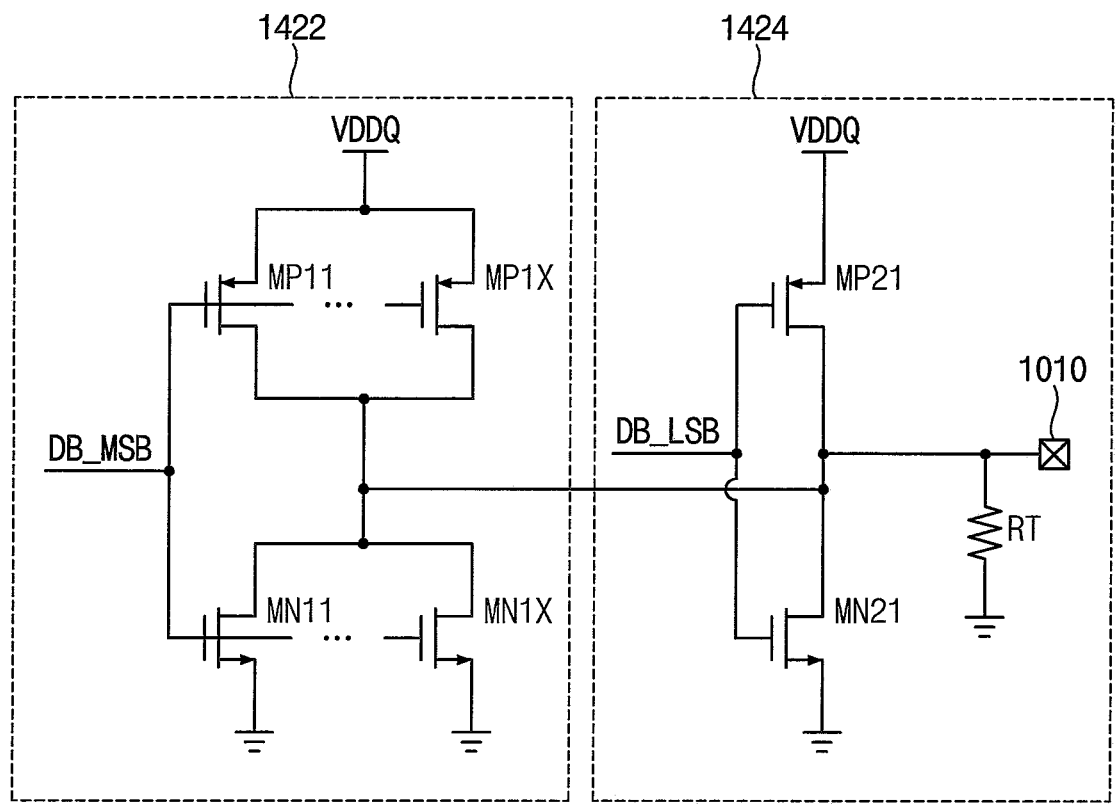
FIG. 6 is a circuit diagram illustrating an example of a transmitter included in a memory device of FIG. 5.

FIG. 6 is a circuit diagram illustrating an example of a transmitter included in a memory device of FIG. 5.

Referring to FIG. 6, a transmitter 1420a may include a first driving circuit 1422 and a second driving circuit 1424.

The first driving circuit 1422 may include a plurality of first pull-up transistors MP11 and MP1X, and a plurality of first pull-down transistors MN11 and MN1X. The second driving circuit 1424 may further include a termination resistor RT.

The plurality of first pull-up transistors MP11 and MP1X may be connected in parallel between a power supply voltage VDDQ and a data I/O pin 1010, and may be selectively turned on based on the first bits DB_MSB. The plurality of first pull-down transistors MN11 and MN1X may be connected in parallel between the data I/O pin 1010 and a ground voltage, and may be selectively turned on based on the first bits DB_MSB.

The second driving circuit 1424 may include a second pull-up transistor MP21 and a second pull-down transistor MN21.

The second pull-up transistor MP21 may be connected between the power supply voltage VDDQ and the data I/O pin 1010, and may be selectively turned on based on the second bits DB_LSB. The second pull-down transistor MN21 may be connected between the data I/O pin 1010 and the ground voltage, and may be selectively turned on based on the second bits DB_LSB.

The termination resistor RT may be connected between the data I/O pin 1010 and the ground voltage.

Four voltage levels (e.g., the voltage levels VL11, VL12, VL13 and VL14 in FIG. 4A) may be generated by controlling on and off of the pull-up transistors MP11, MP1X and MP21 and the pull-down transistors MN11, MN1X and MN21.

In some example embodiments, the pull-up transistors MP11, MP1X and MP21 may be p-type metal oxide semiconductor (PMOS) transistors, and the pull-down transistors MN11, MN1X and MN21 may be n-type metal oxide semiconductor (NMOS) transistors. However, example embodiments are not limited thereto, and the number and types of transistors may be changed according to example embodiments.

Figure 7:
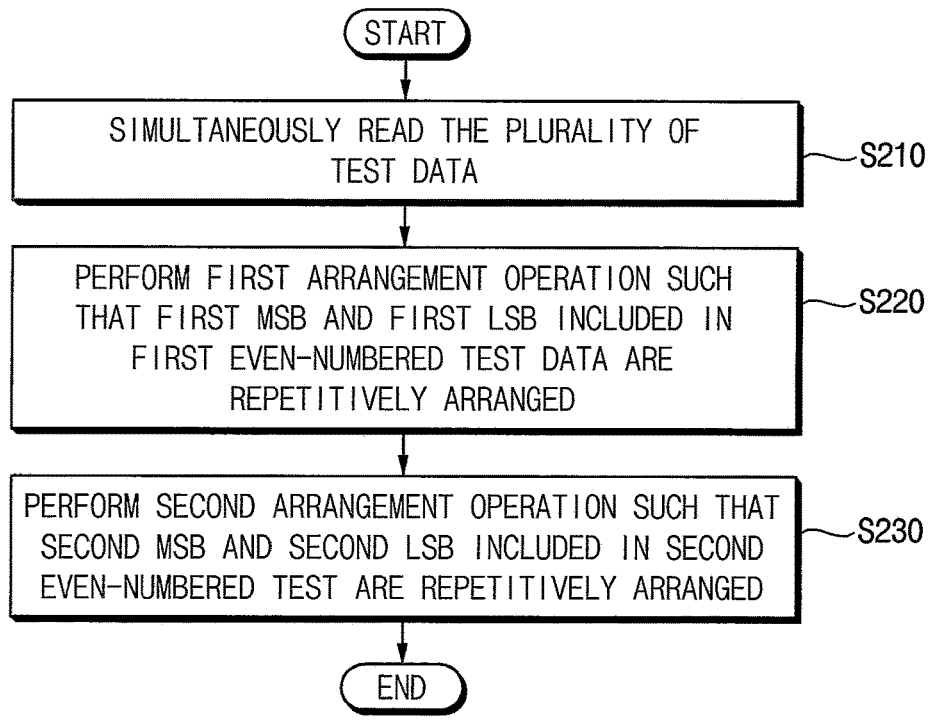
FIG. 7 is a flowchart illustrating an example of arranging first data bits based on a first scheme in FIG. 1.

FIG. 7 is a flowchart illustrating an example of arranging first data bits based on a first scheme in FIG. 1.

Referring to FIGS. 1 and 7, when arranging the first data bits based on the first scheme during the first test mode (step S200 of FIG. 1), the first test mode may be a test mode in which data bits included in even-numbered test data among the plurality of test data are sequentially output. For example, the first test mode may be referred to as an even mode.

During the even mode, the plurality of test data may be approximately simultaneously read (step S210), a first arrangement operation may be performed such that a first MSB and a first LSB included in first even-numbered test data among the plurality of test data are repetitively (or repeatedly) arranged (step S220), and a second arrangement operation may be performed such that a second MSB and a second LSB included in second even-numbered test data among the plurality of test data are repetitively arranged (step S230).

Figure 8:
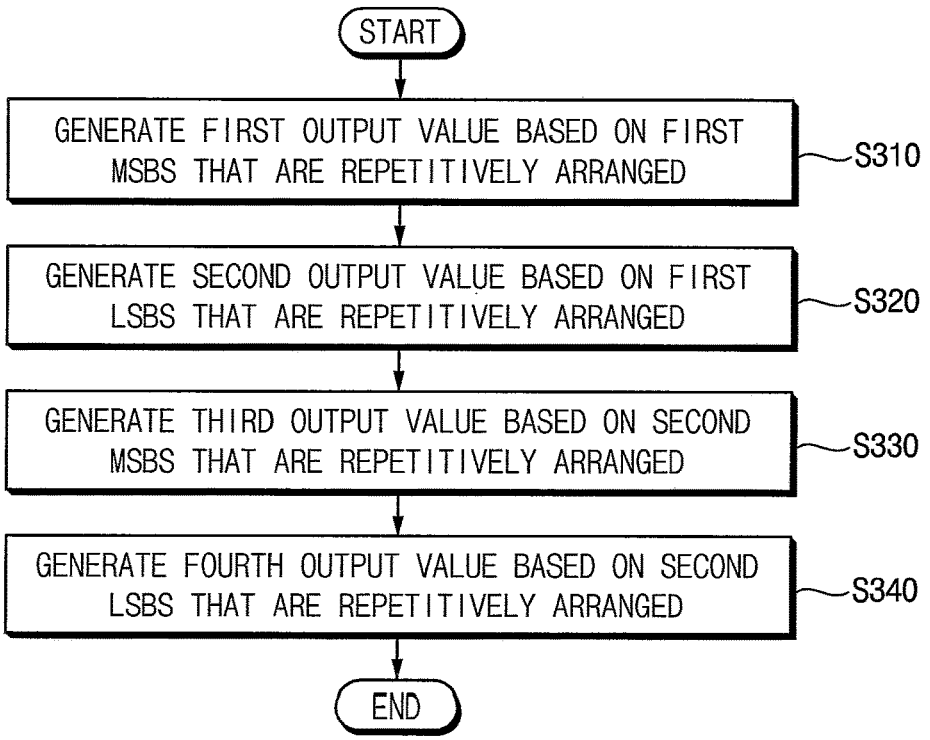
FIG. 8 is a flowchart illustrating an example of generating a first test result signal in FIG. 1.

FIG. 8 is a flowchart illustrating an example of generating a first test result signal in FIG. 1.

Referring to FIGS. 1 and 8, when generating the first test result signal during the first test mode (step S300 of FIG. 1), during the even mode, a first output value included in the first test result signal may be generated based on the first MSBs that are repetitively arranged (step S310), a second output value included in the first test result signal may be generated based on the first LSBs that are repetitively arranged (step S320), a third output value included in the first test result signal may be generated based on the second MSBs that are repetitively arranged (step S330), and a fourth output value included in the first test result signal may be generated based on the second LSBs that are repetitively arranged (step S340).

Figure 9A:
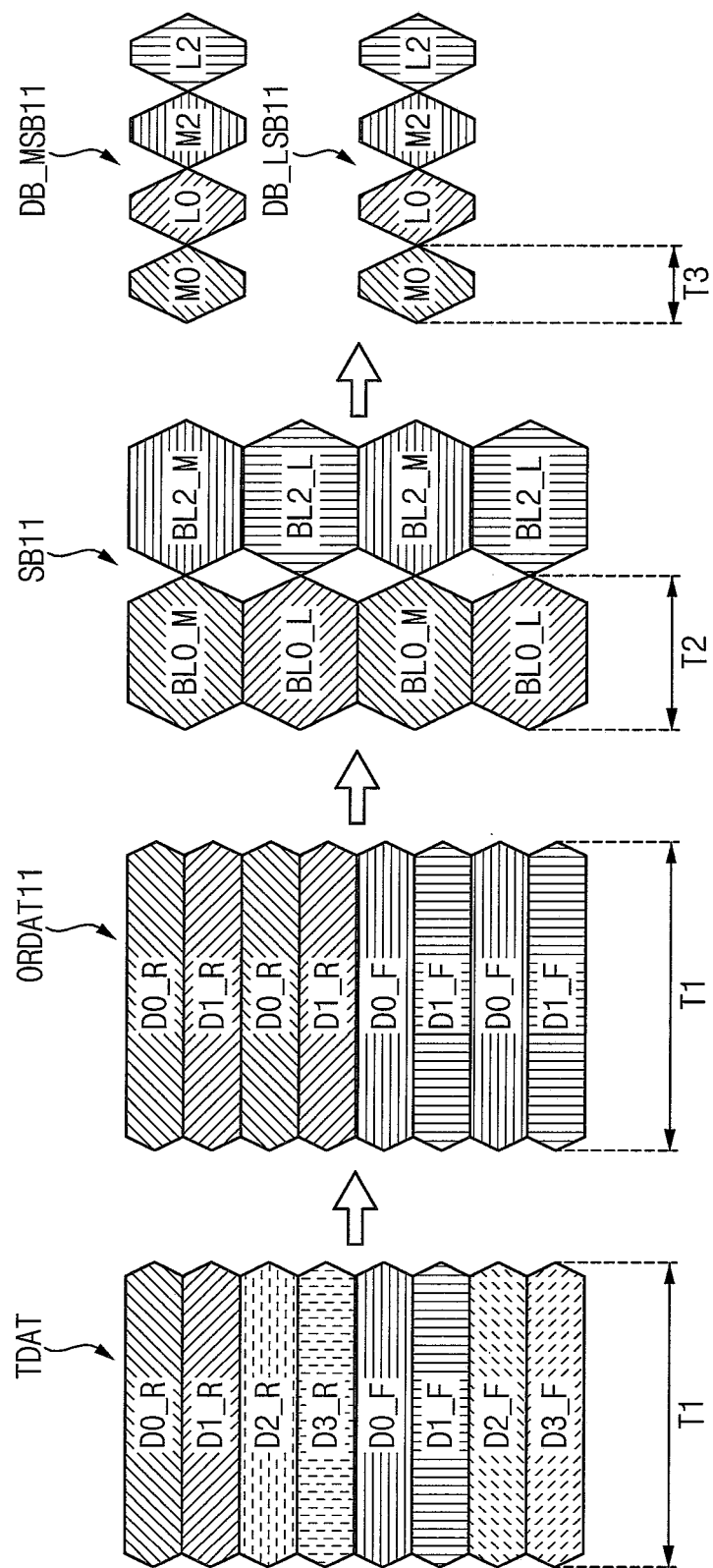
FIGS. 9A and 9B are diagrams for describing operations of FIGS. 7 and 8.
Figure 9B:
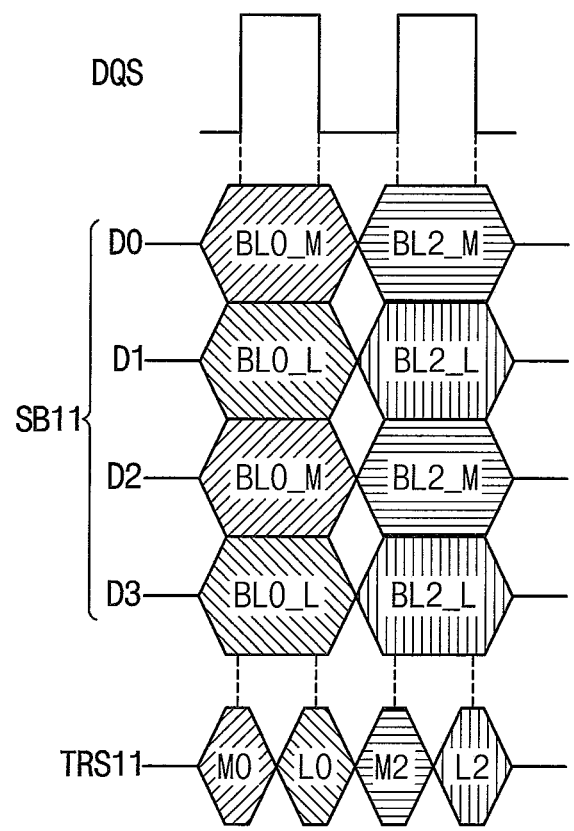

FIGS. 9A and 9B are diagrams for describing operations of FIGS. 7 and 8.

Referring to FIGS. 5, 9A and 9B, the plurality of test data TDAT stored in the memory core 1100 may be read approximately simultaneously (e.g., in parallel). For example, the plurality of test data TDAT may include four test data, each test data may include two data bits, and thus the plurality of test data TDAT may include eight data bits D0_R, D1_R, D2_R, D3_R, D0_F, D1_F, D2_F and D3_F. For example, the data bits D0_R and D1_R may be included in first test data, the data bits D2_R and D3_R may be included in second test data, the data bits D0_F and D1_F may be included in third test data, and the data bits D2_F and D3_F may be included in fourth test data. For example, the data bits D0_R, D1_R, D2_R and D3_R may represent bits sensed at rising edges, and the data bits D0_F, D1_F, D2_F and D3_F may represent bits sensed at falling edges. The data bits D0_R, D1_R, D2_R, D3_R, D0_F, D1_F, D2_F and D3_F may be output with a first data rate T1.

During the even mode, some data bits D0_R, D1_R, D0_F and D1_F among the plurality of test data TDAT may be selected and an arrangement order of the selected data bits D0_R, D1_R, D0_F and D1_F may be changed, by the ordering circuit 1310 of FIG. 5. For example, in data ORDAT11 approximately simultaneously output from the ordering circuit 1310, the data bits D0_R and D1_R may be alternately and repetitively arranged, and the data bits D0_F and D1_F may be alternately and repetitively arranged. The data bits D0_R, D1_R, D0_F and D1_F may also be output with the first data rate T1.

During the even mode, the data bits D0_R, D1_R, D0_F and D1_F included in the data ORDAT11 may be arranged and serialized based on the first scheme, by the selecting circuit 1320. For example, in data bits SB11 sequentially output from the selecting circuit 1320, a first MSB BL0_M and a first LSB BL0_L that are included in the first even-numbered test data may be repetitively arranged first, and then a second MSB BL2_M and a second LSB BL2_L that are included in the second even-numbered test data may be repetitively arranged next. When the first and second arrangement operations and the serialization operation are performed, the data bits BL0_M, BL0_L, BL2_M and BL2_L may be output with a second data rate T2 higher than the first data rate T1. In addition, the first MSBs BL0_M and the first LSBs BL0_L that are repetitively arranged may be provided at the same time (or approximately simultaneously), and then the second MSBs BL2_M and the second LSBs BL2_L that are repetitively arranged may be provided at the same time.

According to example embodiments, test data including data bits (e.g., BL0_M, BL0_L, BL2_M and BL2_L) indicated with respect to even-numbered bit lines (e.g., BL0 and BL2) may be defined as even-numbered test data. For example, the first MSB BL0_M and the first LSB BL0_L may correspond to the data bits D0_R and D1_R, respectively, and the second MSB BL2_M and the second LSB BL2_L may correspond to the data bits D0_F and D1_F, respectively.

During the even mode, the first MSBs BL0_M, the first LSBs BL0_L, the second MSBs BL2_M and the second LSBs BL2_L included in the data bits SB11 may be serialized, by the multiplexer 1410. For example, in each of first bits DB_MSB11 and second bits DB_LBS11 output from the multiplexer 1410 of FIG. 5, a first MSB M0, a first LSB L0, a second MSB M2 and a second LSB L2 may be sequentially arranged. When the serialization operation are performed, the bits M0, L0, M2 and L2 may be output with a third data rate T3 higher than the second data rate T2. The first MSB M0, the first LSB L0, the second MSB M2 and the second LSB L2 may correspond to the first MSB BL0_M, the first LSB BL0_L, the second MSB BL2_M and the second LSB BL2_L, respectively.

As illustrated in FIG. 9B, the first MSBs BL0_M, the first LSBs BL0_L, the second MSBs BL2_M and the second LSBs BL2_L that are included in the data bits SB11 may be provided through different lines D0, D1, D2 and D3. In addition, during the even mode, the transmitter 1420 may generate a first test result signal TRS11, which is synchronized with the data strobe signal DQS, based on the first bits DB_MSB11 and the second bits DB_LBS11. For example, a first output value (or bit) M0 that corresponds to the first MSB M0 may be generated in synchronization with a rising edge of the data strobe signal DQS, a second output value (or bit) L0 that corresponds to the first LSB L0 may be generated in synchronization with a falling edge of the data strobe signal DQS, a third output value (or bit) M2 that corresponds to the second MSB M2 may be generated in synchronization with a rising edge of the data strobe signal DQS, and a fourth output value (or bit) L2 that corresponds to the second LSB L2 may be generated in synchronization with a falling edge of the data strobe signal DQS. When the first test result signal TRS11 that is a two-level signal is generated, the first, second, third and fourth output values M0, L0, M2 and L2 may be sequentially provided.

Figure 10:
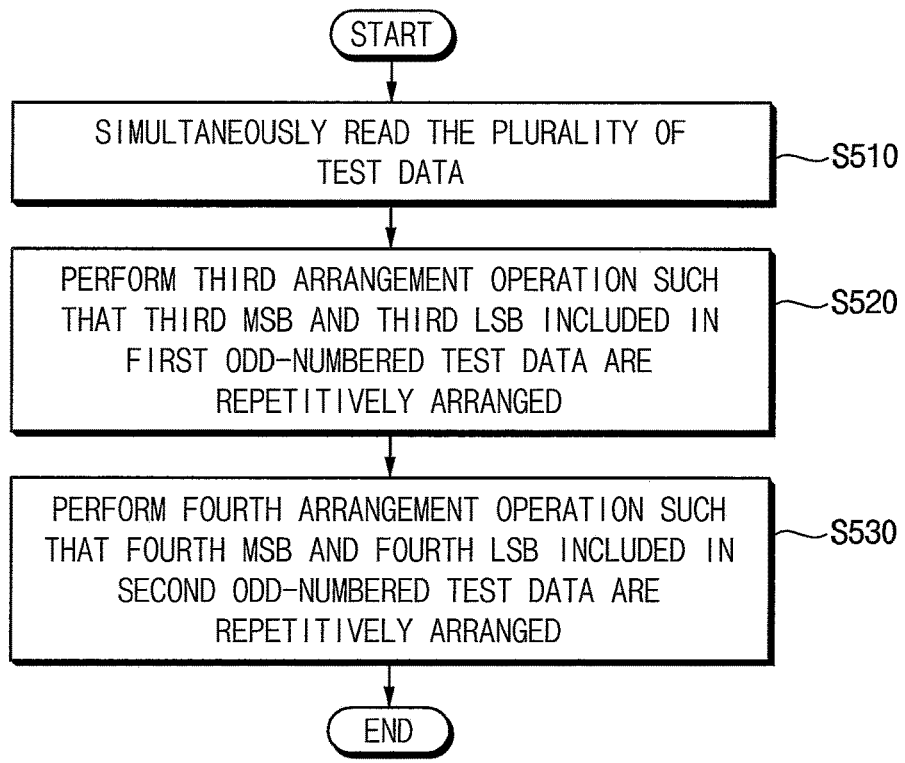
FIG. 10 is a flowchart illustrating an example of arranging second data bits based on a second scheme in FIG. 1.

FIG. 10 is a flowchart illustrating an example of arranging second data bits based on a second scheme in FIG. 1.

Referring to FIGS. 1 and 10, when arranging the second data bits based on the second scheme during the second test mode (step S500 of FIG. 1), the second test mode may be a test mode in which data bits included in odd-numbered test data among the plurality of test data are sequentially output. For example, the second test mode may be referred to as an odd mode.

During the odd mode, step S510 may be substantially the same as step S210 in FIG. 7. A third arrangement operation may be performed such that a third MSB and a third LSB that are included in the first odd-numbered test data among the plurality of test data are repetitively arranged (step S520), and a fourth arrangement operation may be performed such that a fourth MSB and a fourth LSB that are included in second odd-numbered test data among the plurality of test data are repetitively arranged (step S530).

Figure 11:
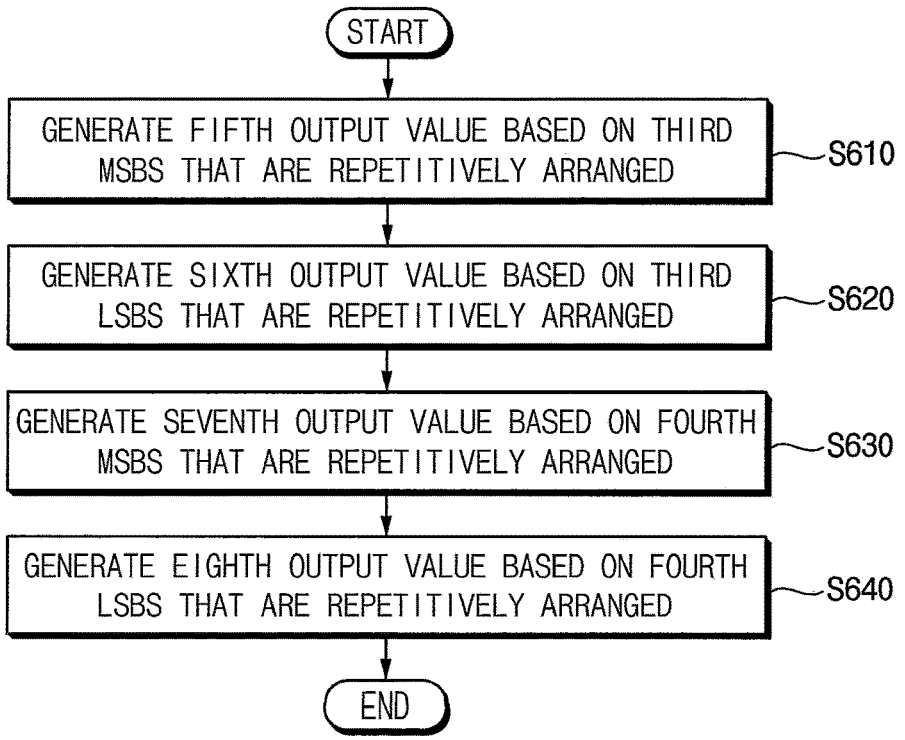
FIG. 11 is a flowchart illustrating an example of generating a second test result signal in FIG. 1.

FIG. 11 is a flowchart illustrating an example of generating a second test result signal in FIG. 1.

Referring to FIGS. 1 and 11, when generating the second test result signal during the second test mode (step S600 of FIG. 1), during the odd mode, a fifth output value included in the second test result signal may be generated based on the third MSBs that are repetitively arranged (step S610), a sixth output value included in the second test result signal may be generated based on the third LSBs that are repetitively arranged (step S620), a seventh output value included in the second test result signal may be generated based on the fourth MSBs that are repetitively arranged (step S630), and an eighth output value included in the second test result signal may be generated based on the fourth LSBs that are repetitively arranged (step S640).

Figure 12A:
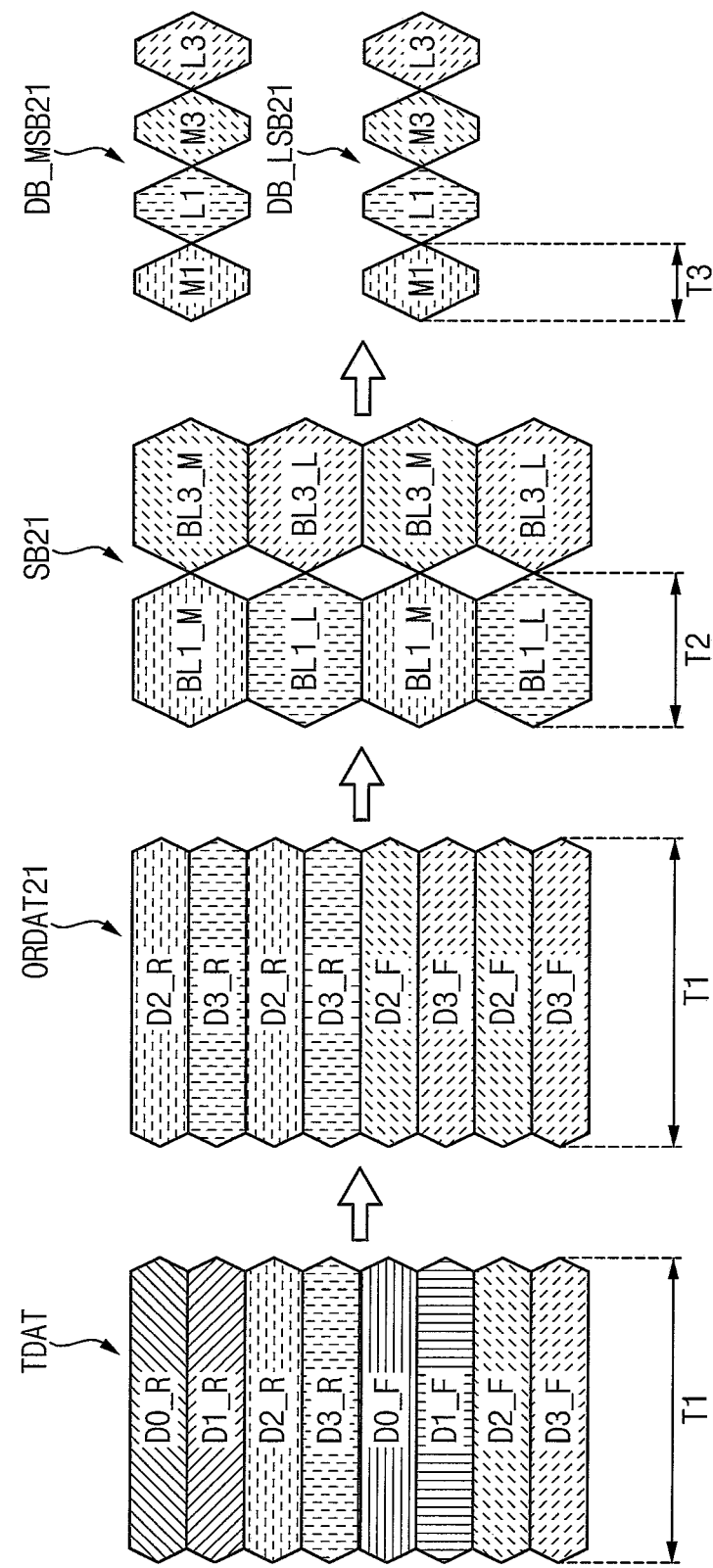
FIGS. 12A and 12B are diagrams for describing operations of FIGS. 10 and 11.
Figure 12B:
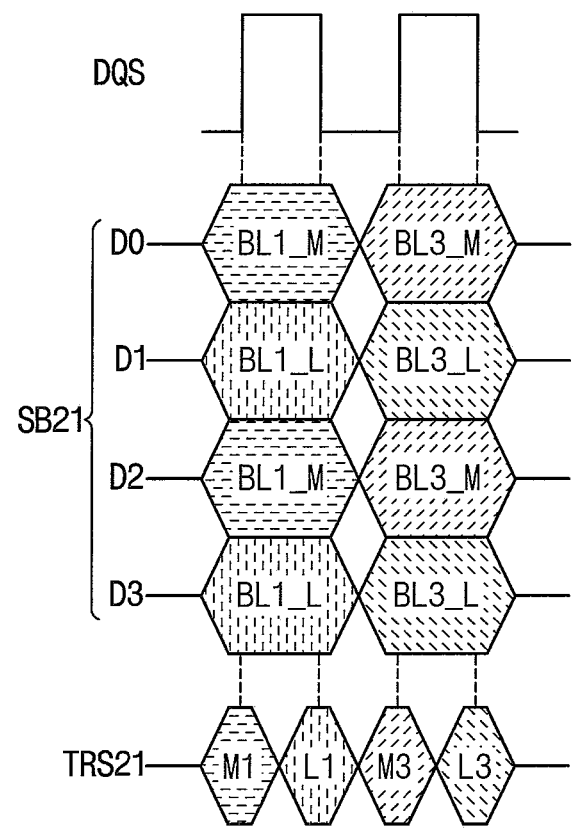

FIGS. 12A and 12B are diagrams for describing operations of FIGS. 10 and 11. The descriptions repeated with FIGS. 9A and 9B will be omitted.

Referring to FIGS. 5, 12A and 12B, the plurality of test data TDAT may be read based on a manner substantially the same as that described with reference to FIG. 9A.

During the odd mode, the other data bits D2_R, D3_R, D2_F and D3_F among the plurality of test data TDAT may be selected and an arrangement order of the selected data bits D2_R, D3_R, D2_F and D3_F may be changed, by the ordering circuit 1310. For example, in data ORDAT21 approximately simultaneously output from the ordering circuit 1310, the data bits D2_R and D3_R may be alternately and repetitively arranged, and the data bits D2_F and D3_F may be alternately and repetitively arranged.

During the odd mode, the data bits D2_R, D3_R, D2_F and D3_F included in the data ORDAT21 may be arranged and serialized based on the second scheme, by the selecting circuit 1320. For example, in data bits SB21 sequentially output from the selecting circuit 1320, a third MSB BL1_M and a third LSB BL1_L that are included in the first odd-numbered test data may be repetitively arranged first, and then a fourth MSB BL3_M and a fourth LSB BL3_L that are included in the second odd-numbered test data may be repetitively arranged next.

According to example embodiments, test data including data bits (e.g., BL1_M, BL1_L, BL3_M and BL3_L) indicated with respect to odd-numbered bit lines (e.g., BL1 and BL3) may be defined as odd-numbered test data. For example, the third MSB BL1_M and the third LSB BL1_L may correspond to the data bits D2_R and D3_R, respectively, and the fourth MSB BL3_M and the fourth LSB BL3_L may correspond to the data bits D2_F and D3_F, respectively.

During the odd mode, the third MSBs BL1_M, the third LSBs BL1_L, the fourth MSBs BL3_M and the fourth LSBs BL3_L included in the data bits SB21 may be serialized, by the multiplexer 1410. For example, in each of first bits DB_MSB21 and second bits DB_LBS21 output from the multiplexer 1410, a third MSB M1, a third LSB L1, a fourth MSB M3 and a fourth LSB L3 may be sequentially arranged. The third MSB M1, the third LSB L1, the fourth MSB M3 and the fourth LSB L3 may correspond to the third MSB BL1_M, the third LSB BL1_L, the fourth MSB BL3_M and the fourth LSB BL3_L, respectively.

During the odd mode, the transmitter 1420 may generate a second test result signal TRS21, which is synchronized with the data strobe signal DQS, based on the first bits DB_MSB21 and the second bits DB_LBS21. When the second test result signal TRS21 that is a two-level signal is generated, fifth, sixth, seventh and eighth output values M1, L1, M3 and L3, which correspond to the third MSB M1, the third LSB L1, the fourth MSB M3 and the fourth LSB L3, respectively, may be sequentially provided.

As described with reference to FIGS. 7, 8, 9A, 9B, 10, 11, 12A and 12B, when the first test result signal TRS11 is generated in the even mode and the second test result signal TRS21 is generated in the odd mode, data bits included in the plurality of test data TDAT may be read.

FIG. 13 is a table illustrating an example of a result in a first test mode of FIGS. 7 and 8 and a result in a second test mode of FIGS. 10 and 11.

Referring to FIG. 13, CASE1 represent that each of the first and second output values in the first test result signal TRS11 during the first test mode (e.g., the even mode MD EVEN) is '0' and each of the fifth and sixth output values in the second test result signal TRS21 during the second test mode (e.g., the odd mode MD ODD) is '1', when the first even-numbered test data is '00' and the first odd-numbered test data is '11'. CASE2 represent that the first and second output values in the first test result signal TRS11 are '0' and '1', respectively, and the fifth and sixth output values in the second test result signal TRS21 are '1' and '0', respectively, when the first even-numbered test data is '01' and the first odd-numbered test data is '10'.

Figure 14A:
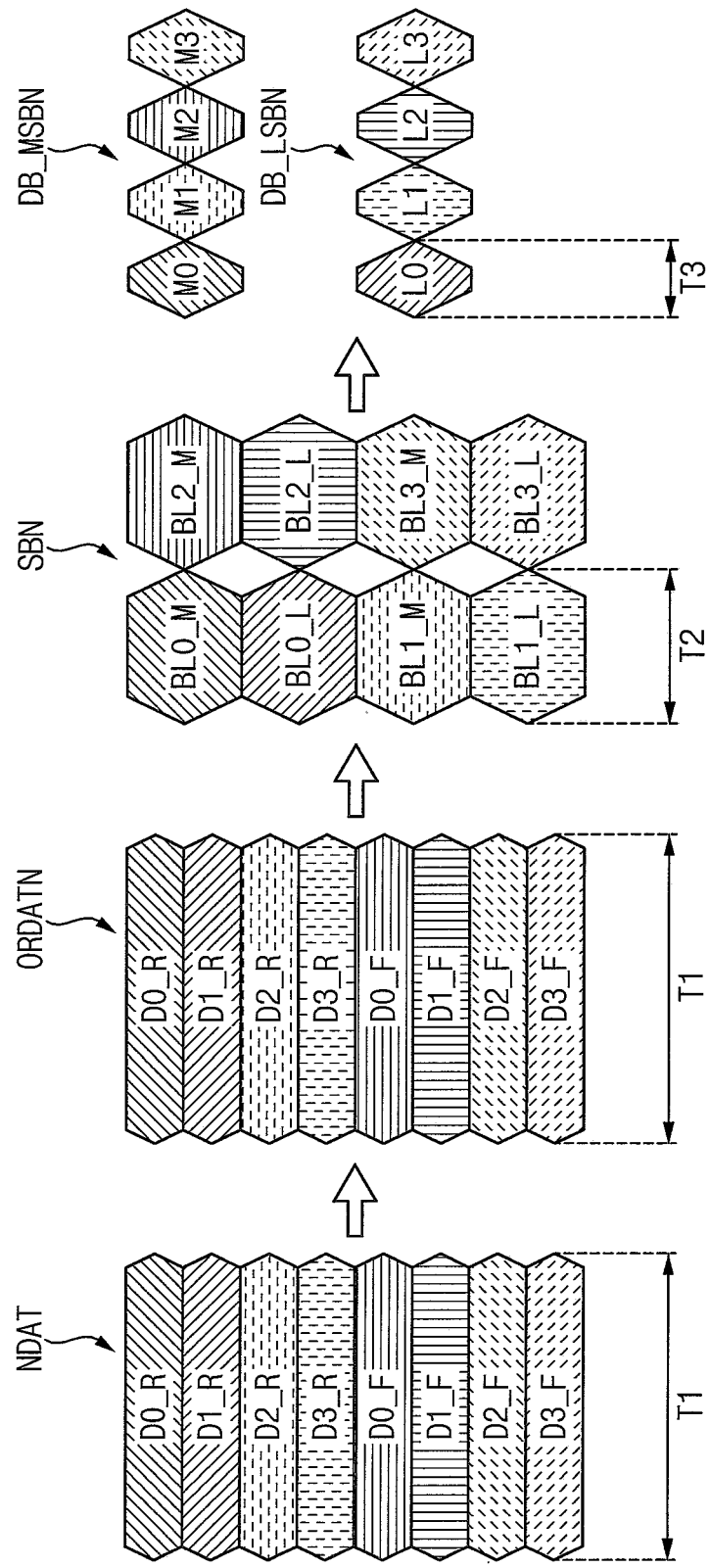
FIGS. 14A and 14B are diagrams for describing operations of a memory device of FIG. 5 during a normal mode.
Figure 14B:
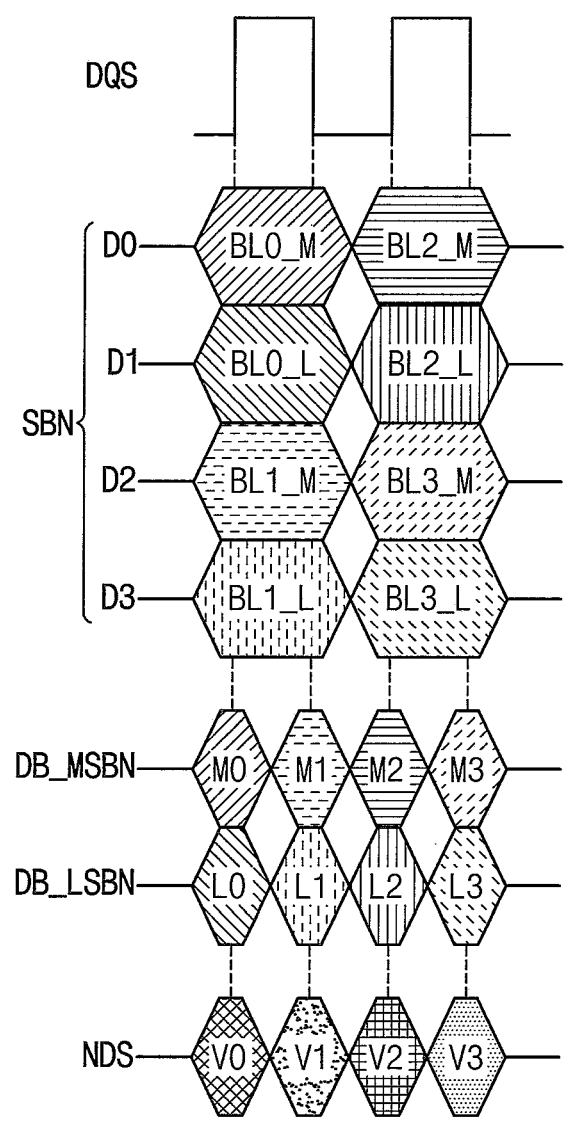

FIGS. 14A and 14B are diagrams for describing operations of a memory device of FIG. 5 during a normal mode. The descriptions repeated with FIGS. 9A and 9B will be omitted.

Referring to FIGS. 5, 14A and 14B, the plurality of normal data NDAT may be read based on a manner substantially the same as that described with reference to FIG. 9A.

During the normal mode, the ordering circuit 1310 may not change an arrangement order of the data bits D0_R, D1_R, D2_R, D3_R, D0_F, D1_F, D2_F and D3_F in the plurality of normal data NDAT, and may output the data bits D0_R, D1_R, D2_R, D3_R, D0_F, D1_F, D2_F and D3_F as data ORDATN.

During the normal mode, the data bits D0_R, D1_R, D2_R, D3_R, D0_F, D1_F, D2_F and D3_F included in the data ORDATN may be arranged and serialized based on the third scheme, by the selecting circuit 1320. For example, in data bits SBN sequentially output from the selecting circuit 1320, a MSB BL0_M, a LSB BL0_L, a MSB BL1_M and a LSB BL1_L may be repetitively arranged first, and then a MSB BL2_M, a LSB BL2_L, a MSB BL3_M and a LSB BL3_L may be repetitively arranged next.

During the normal mode, the MSBs BL0_M, BL1_M, BL2_M and BL3_M and the LSBs BL0_L, BL1_L, BL2_L and BL3_L included in the data bits SBN may be serialized, by the multiplexer 1410. For example, in the first bits DB_MSBN that are output from the multiplexer 1410, MSBs M0, M1, M2 and M3 may be sequentially arranged. In the second bits DB_LBSN that are output from the multiplexer 1410, LSBs L0, L1, L2 and L3 may be sequentially arranged.

During the normal mode, the transmitter 1420 may generate a normal data signal NDS, which is synchronized with the data strobe signal DQS, based on the first bits DB_MSBN and the second bits DB_LBSN. When the normal data signal NDS that is a PAM4 signal is generated, a first output value V0 corresponding to the MSB M0 and the LSB L0, a second output value V1 corresponding to the MSB M1 and the LSB L1, a third output value V2 corresponding to the MSB M2 and the LSB L2, and a fourth output value V3 corresponding to the MSB M3 and the LSB L3 may be sequentially provided.

Figure 15:
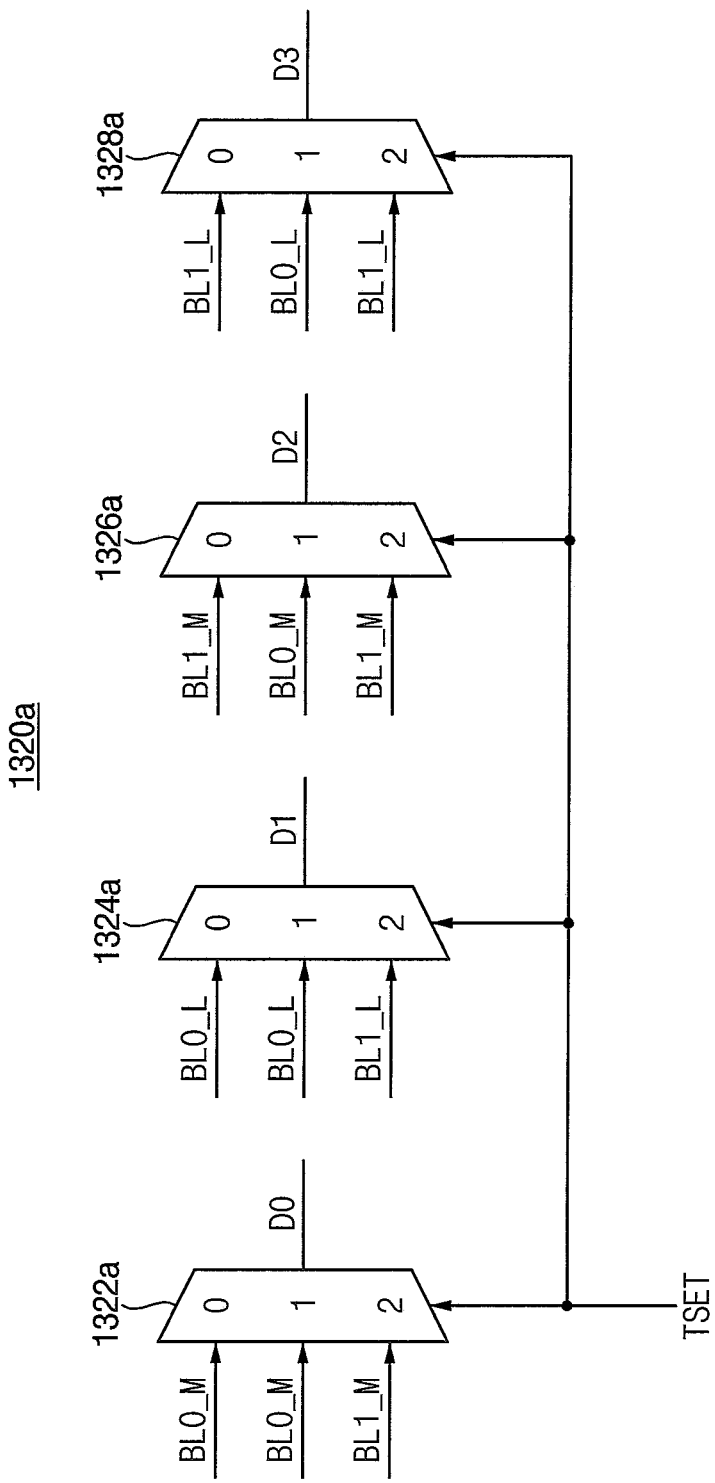
FIG. 15 is a block diagram illustrating an example of a selecting circuit included in a memory device of FIG. 5.

FIG. 15 is a block diagram illustrating an example of a selecting circuit included in a memory device of FIG. 5.

Referring to FIG. 15, a selecting circuit 1320a may include a first multiplexer 1322a, a second multiplexer 1324a, a third multiplexer 1326a and a fourth multiplexer 1328a. FIG. 15 illustrates an example where the first test mode and the second test mode are the even mode and the odd mode, respectively.

The first through fourth multiplexers 1322a, 1324a, 1326a and 1328a may operate based on the setting signal TSET. For example, when the setting signal TSET has a first value (e.g., '0'), the data bits BL0_M, BL0_L, BL1_M and BL1_L may be output to the lines D0, D1, D2 and D3, respectively, during the normal mode. When the setting signal TSET has a second value (e.g., '1'), the data bits BL0_M, BL0_L, BL0_M and BL0_L may be output to the lines D0, D1, D2 and D3, respectively, during the even mode. When the setting signal TSET has a third value (e.g., '2'), the data bits BL1_M, BL1_L, BL1_M and BL1_L may be output to the lines D0, D1, D2 and D3, respectively, during the odd mode.

Figure 16:
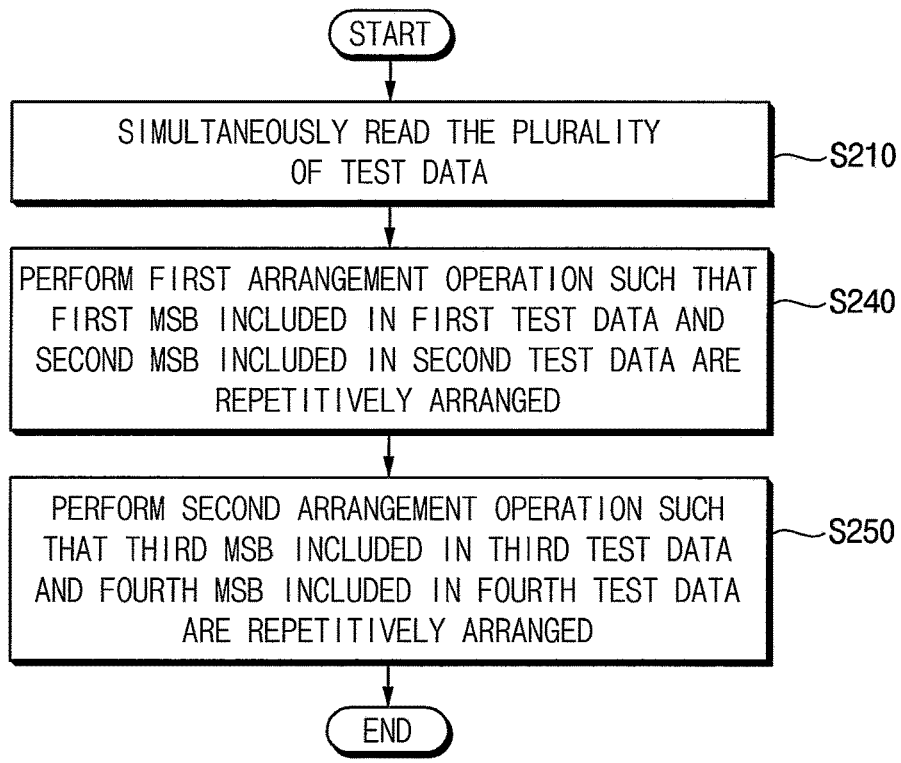
FIG. 16 is a flowchart illustrating another example of arranging first data bits based on a first scheme in FIG. 1.

FIG. 16 is a flowchart illustrating another example of arranging first data bits based on a first scheme in FIG. 1. The descriptions repeated with FIG. 7 will be omitted.

Referring to FIGS. 1 and 16, when arranging the first data bits based on the first scheme during the first test mode (step S200 of FIG. 1), the first test mode may be a test mode in which MSBs included in the plurality of test data are sequentially output. For example, the first test mode may be referred to as a MSB mode.

During the MSB mode, step S210 may be substantially the same as step S210 in FIG. 7. A first arrangement operation may be performed such that a first MSB included in first test data among the plurality of test data and a second MSB included in second test data among the plurality of test data are repetitively arranged (step S240), and a second arrangement operation may be performed such that a third MSB included in third test data among the plurality of test data and a fourth MSB included in fourth test data among the plurality of test data are repetitively arranged (step S250).

Figure 17:
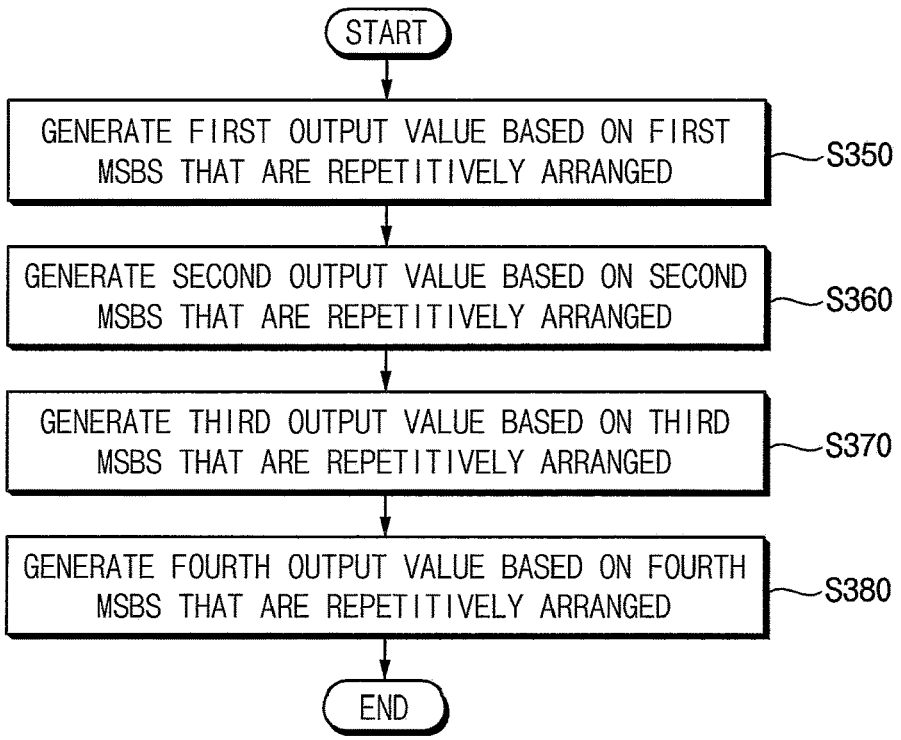
FIG. 17 is a flowchart illustrating another example of generating a first test result signal in FIG. 1.

FIG. 17 is a flowchart illustrating another example of generating a first test result signal in FIG. 1. The descriptions repeated with FIG. 8 will be omitted.

Referring to FIGS. 1 and 17, when generating the first test result signal during the first test mode (step S300 of FIG. 1), during the MSB mode, a first output value included in the first test result signal may be generated based on the first MSBs that are repetitively arranged (step S350), a second output value included in the first test result signal may be generated based on the second MSBs that are repetitively arranged (step S360), a third output value included in the first test result signal may be generated based on the third MSBs that are repetitively arranged (step S370), and a fourth output value included in the first test result signal may be generated based on the fourth MSBs that are repetitively arranged (step S380).

Figure 18A:
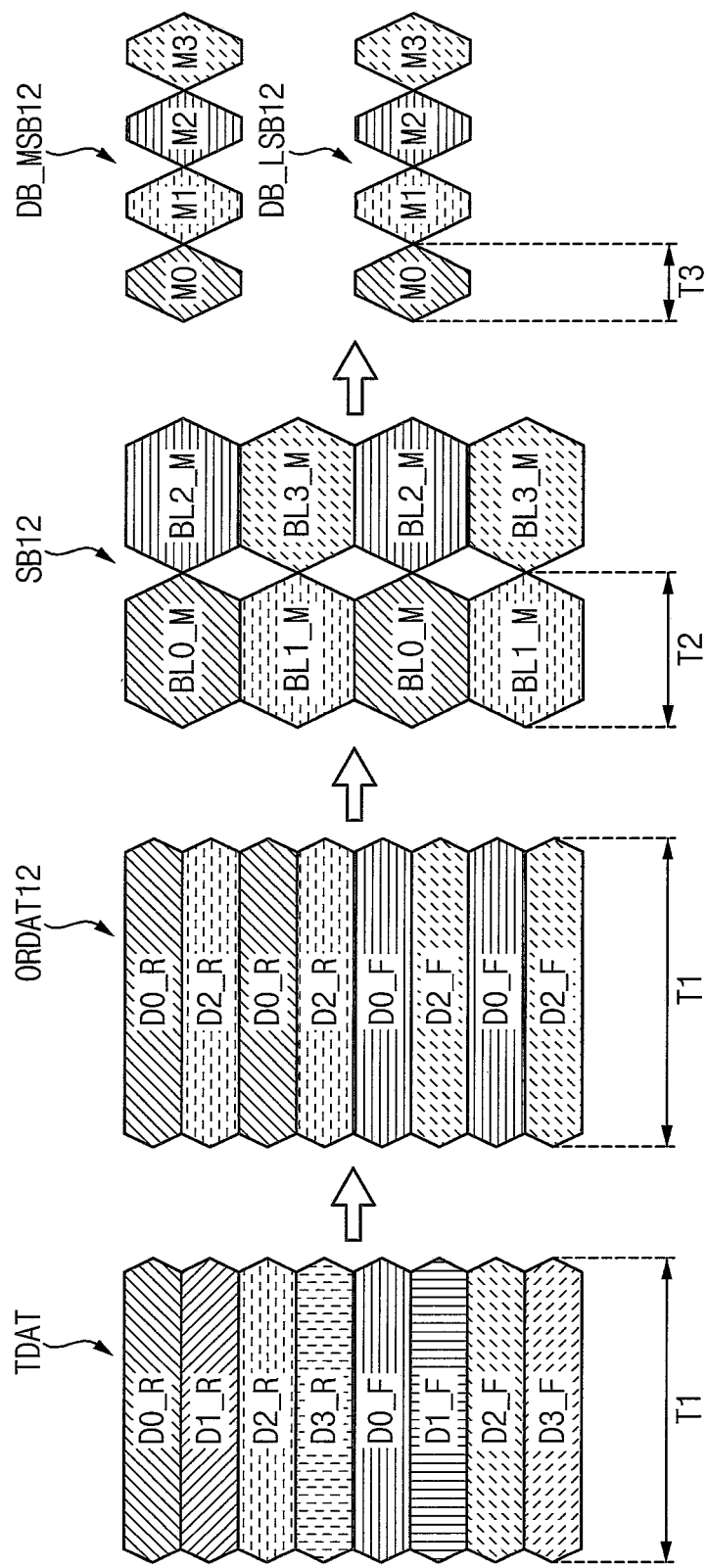
FIGS. 18A and 18B are diagrams for describing operations of FIGS. 16 and 17.
Figure 18B:
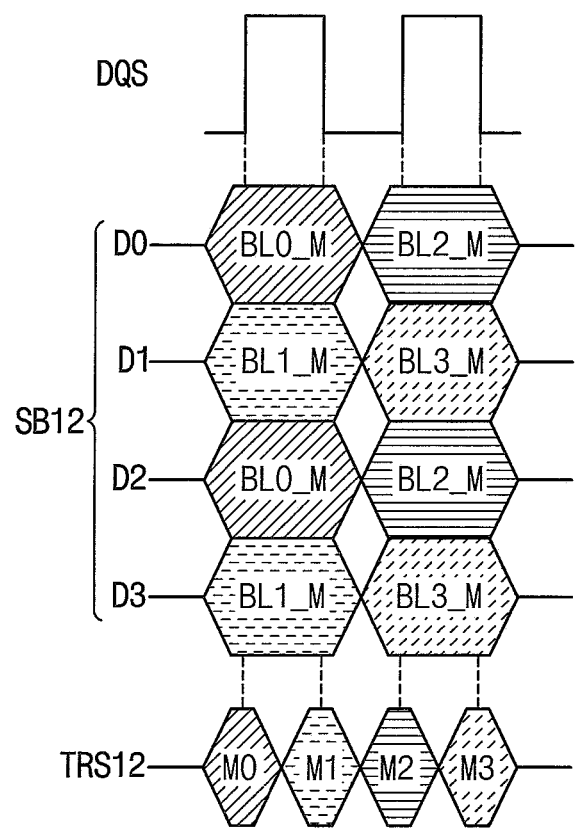

FIGS. 18A and 18B are diagrams for describing operations of FIGS. 16 and 17. The descriptions repeated with FIGS. 9A, 9B, 12A and 12B will be omitted.

Referring to FIGS. 5, 18A and 18B, the plurality of test data TDAT may be read based on a manner substantially the same as that described with reference to FIG. 9A.

During the MSB mode, some data bits D0_R, D2_R, D0_F and D2_F among the plurality of test data TDAT may be selected and an arrangement order of the selected data bits D0_R, D2_R, D0_F and D2_F may be changed, by the ordering circuit 1310. For example, in data ORDAT12 approximately simultaneously output from the ordering circuit 1310, the data bits D0_R and D2_R may be alternately and repetitively arranged, and the data bits D0_F and D2_F may be alternately and repetitively arranged.

During the MSB mode, the data bits D0_R, D2_R, D0_F and D2_F included in the data ORDAT12 may be arranged and serialized based on a fourth scheme, by the selecting circuit 1320. For example, in data bits SB12 sequentially output from the selecting circuit 1320, a first MSB BL0_M included in the first test data and a second MSB BL1_M included in the second test data may be repetitively arranged first, and then a third MSB BL2_M included in the third test data and a fourth MSB BL3_M included in the fourth test data may be repetitively arranged next.

According to example embodiments, test data including data bits (e.g., BL0_M, BL M, BL2_M and BL3_M) indicated with respect to first, second, third and fourth bit lines (e.g., BL0, BL1, BL2 and BL3) may be defined as the first, second, third and fourth test data.

During the MSB mode, the first MSBs BL0_M, the second MSBs BL1_M, the third MSBs BL2_M and the fourth MSBs BL3_M included in the data bits SB12 may be serialized, by the multiplexer 1410. For example, in each of first bits DB_MSB12 and second bits DB_LBS12 output from the multiplexer 1410, a first MSB M0, a second MSB M1, a third MSB M2 and a fourth MSB M3 may be sequentially arranged.

During the MSB mode, the transmitter 1420 may generate a first test result signal TRS12, which is synchronized with the data strobe signal DQS, based on the first bits DB_MSB12 and the second bits DB_LBS12. When the first test result signal TRS12 that is a two-level signal is generated, first, second, third and fourth output values M0, M1, M2 and M3, which correspond to the first, second, third and fourth MSBs M0, M1, M2 and M3, respectively, may be sequentially provided.

Figure 19:
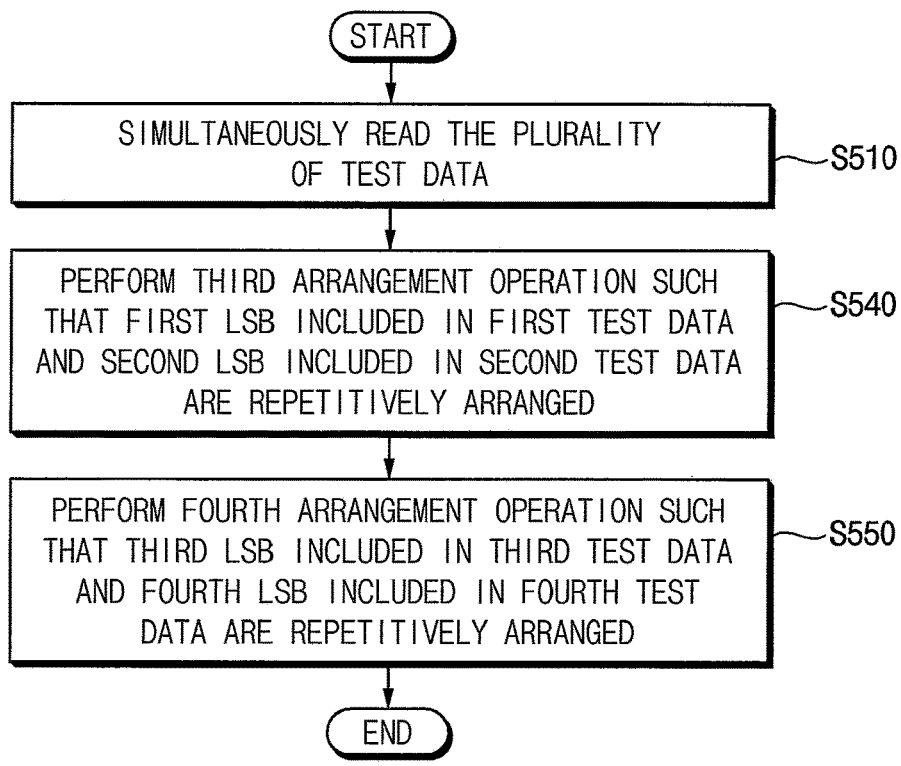
FIG. 19 is a flowchart illustrating another example of arranging second data bits based on a second scheme in FIG. 1.

FIG. 19 is a flowchart illustrating another example of arranging second data bits based on a second scheme in FIG. 1. The descriptions repeated with FIG. 10 will be omitted.

Referring to FIGS. 1 and 19, when arranging the second data bits based on the second scheme during the second test mode (step S500 of FIG. 1), the second test mode may be a test mode in which LSBs included in the plurality of test data are sequentially output. For example, the second test mode may be referred to as a LSB mode.

During the LSB mode, step S510 may be substantially the same as step S510 in FIG. 10. A third arrangement operation may be performed such that a first LSB included in the first test data and a second LSB included in the second test data are repetitively arranged (step S540), and a fourth arrangement operation may be performed such that a third LSB included in the third test data and a fourth LSB included in the fourth test data are repetitively arranged (step S550).

Figure 20:
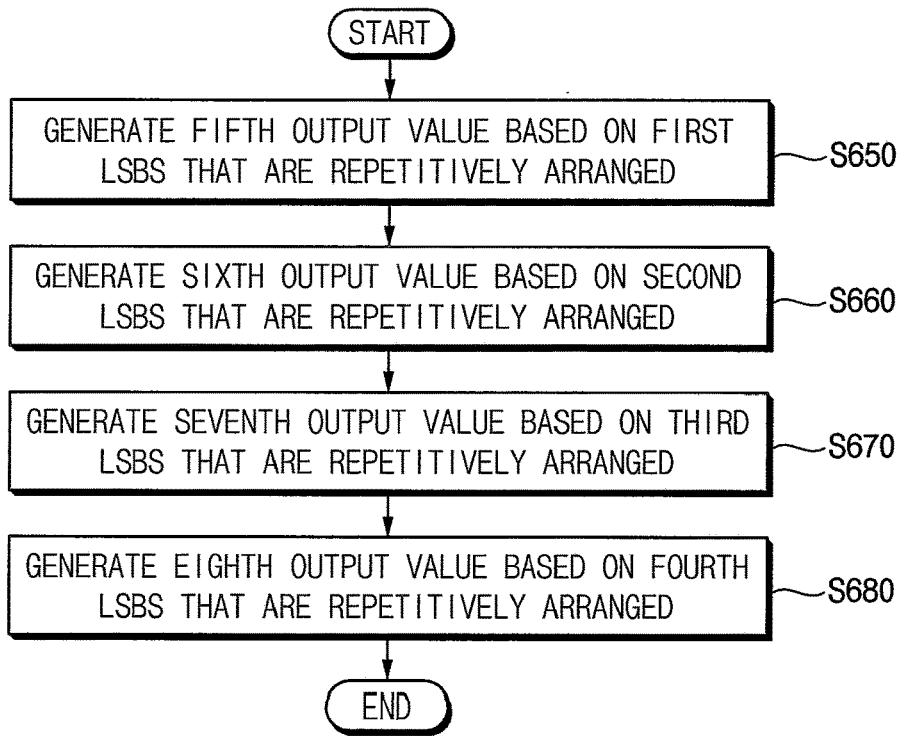
FIG. 20 is a flowchart illustrating another example of generating a second test result signal in FIG. 1.

FIG. 20 is a flowchart illustrating another example of generating a second test result signal in FIG. 1. The descriptions repeated with FIG. 11 will be omitted.

Referring to FIGS. 1 and 20, when generating the second test result signal during the second test mode (step S600 of FIG. 1), during the LSB mode, a fifth output value included in the second test result signal may be generated based on the first LSBs that are repetitively arranged (step S650), a sixth output value included in the second test result signal may be generated based on the second LSBs that are repetitively arranged (step S660), a seventh output value included in the second test result signal may be generated based on the third LSBs that are repetitively arranged (step S670), and an eighth output value included in the second test result signal may be generated based on the fourth LSBs that are repetitively arranged (step S680).

Figure 21A:
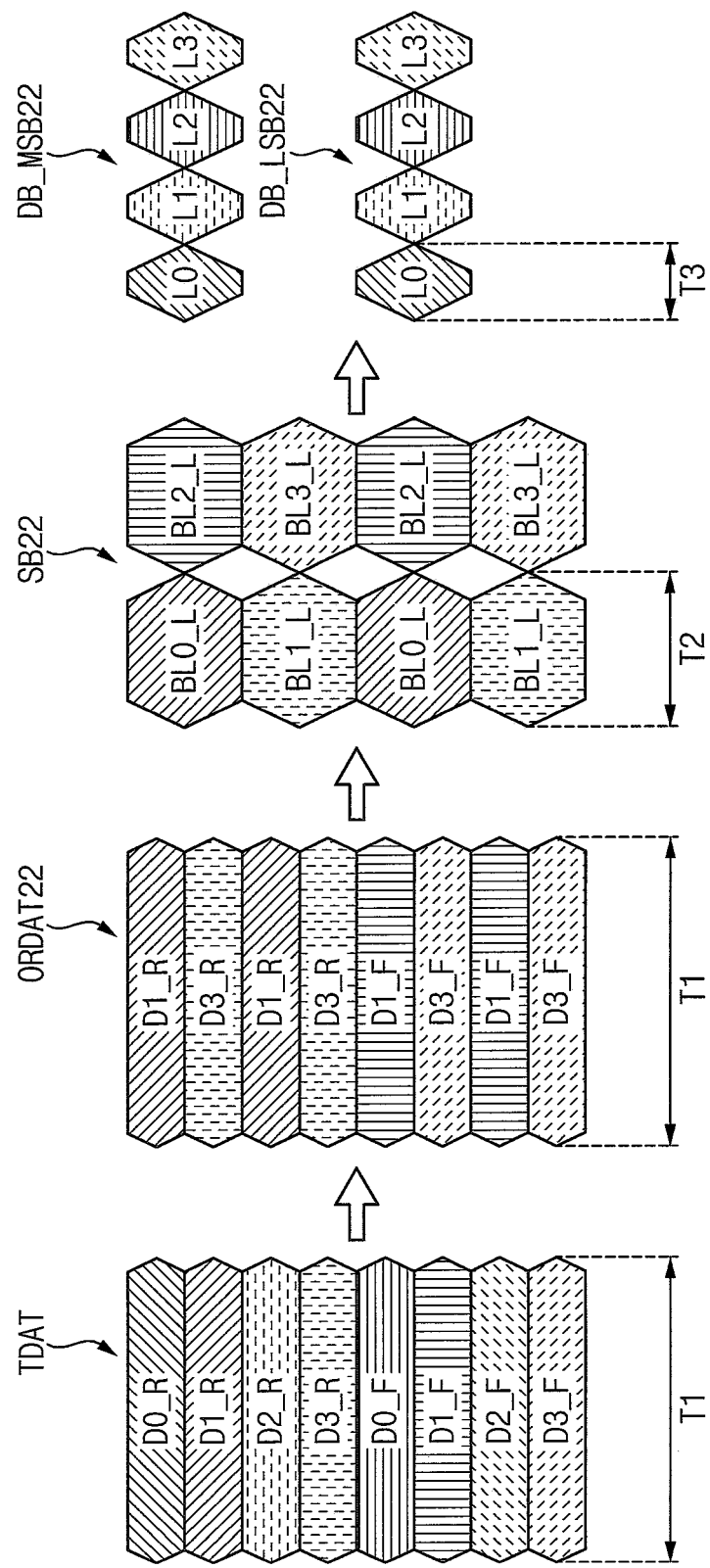
FIGS. 21A and 21B are diagrams for describing operations of FIGS. 19 and 20.
Figure 21B:
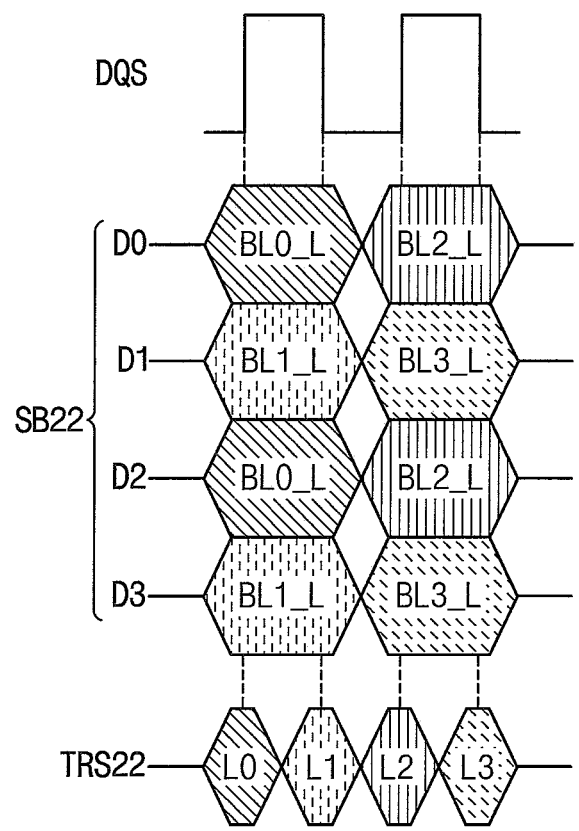

FIGS. 21A and 21B are diagrams for describing operations of FIGS. 19 and 20. The descriptions repeated with FIGS. 9A, 9B, 12A and 12B will be omitted.

Referring to FIGS. 5, 21A and 21B, the plurality of test data TDAT may be read based on a manner substantially the same as that described with reference to FIG. 9A.

During the LSB mode, the other data bits D1_R, D3_R, D1_F and D3_F among the plurality of test data TDAT may be selected and an arrangement order of the selected data bits D1_R, D3_R, D1_F and D3_F may be changed, by the ordering circuit 1310. For example, in data ORDAT22 approximately simultaneously output from the ordering circuit 1310, the data bits D1_R and D3_R may be alternately and repetitively arranged, and the data bits D1_F and D3_F may be alternately and repetitively arranged.

During the LSB mode, the data bits D1_R, D3_R, D1_F and D3_F included in the data ORDAT22 may be arranged and serialized based on a fifth scheme, by the selecting circuit 1320. For example, in data bits SB22 sequentially output from the selecting circuit 1320, a first LSB BL0_L included in the first test data and a second LSB BL1_L included in the second test data may be repetitively arranged first, and then a third LSB BL2_L included in the third test data and a fourth LSB BL3_L included in the fourth test data may be repetitively arranged next.

During the LSB mode, the first LSBs BL0_L, the second LSBs BL1_L, the third LSBs BL2_L and the fourth LSBs BL3_L included in the data bits SB22 may be serialized, by the multiplexer 1410. For example, in each of first bits DB_MSB22 and second bits DB_LBS22 output from the multiplexer 1410, a first LSB L0, a second LSB L1, a third LSB L2 and a fourth LSB L3 may be sequentially arranged.

During the LSB mode, the transmitter 1420 may generate a second test result signal TRS22, which is synchronized with the data strobe signal DQS, based on the first data bits DB_MSB22 and the second data bits DB_LBS22. When the second test result signal TRS22 that is a two-level signal is generated, fifth, sixth, seventh and eighth output values L0, L1, L2 and L3, which correspond to the first, second, third and fourth LSBs L0, L1, L2 and L3, respectively, may be sequentially provided.

As described with reference to FIGS. 16, 17, 18A, 18B, 19, 20, 21A and 21B, when the first test result signal TRS12 is generated in the MSB mode and the second test result signal TRS22 is generated in the LSB mode, all data bits included in the plurality of test data TDAT may be read.

FIG. 22 is a table illustrating an example of a result in a first test mode of FIGS. 16 and 17 and a result in a second test mode of FIGS. 19 and 20.

Referring to FIG. 22, CASE1 represent that the first and second output values in the first test result signal TRS12 during the first test mode (e.g., the MSB mode MD MSB) are '0' and '1', respectively, and the fifth and sixth output values in the second test result signal TRS22 during the second test mode (e.g., the LSB mode MD LSB) are '0' and '1', respectively, when the first test data is '00' and the second test data is '11'. CASE2 represent that the first and second output values in the first test result signal TRS12 are '0' and '1', respectively, and the fifth and sixth output values in the second test result signal TRS22 are '1' and '0', respectively, when the first test data is '01' and the second test data is '10'.

Figure 23:
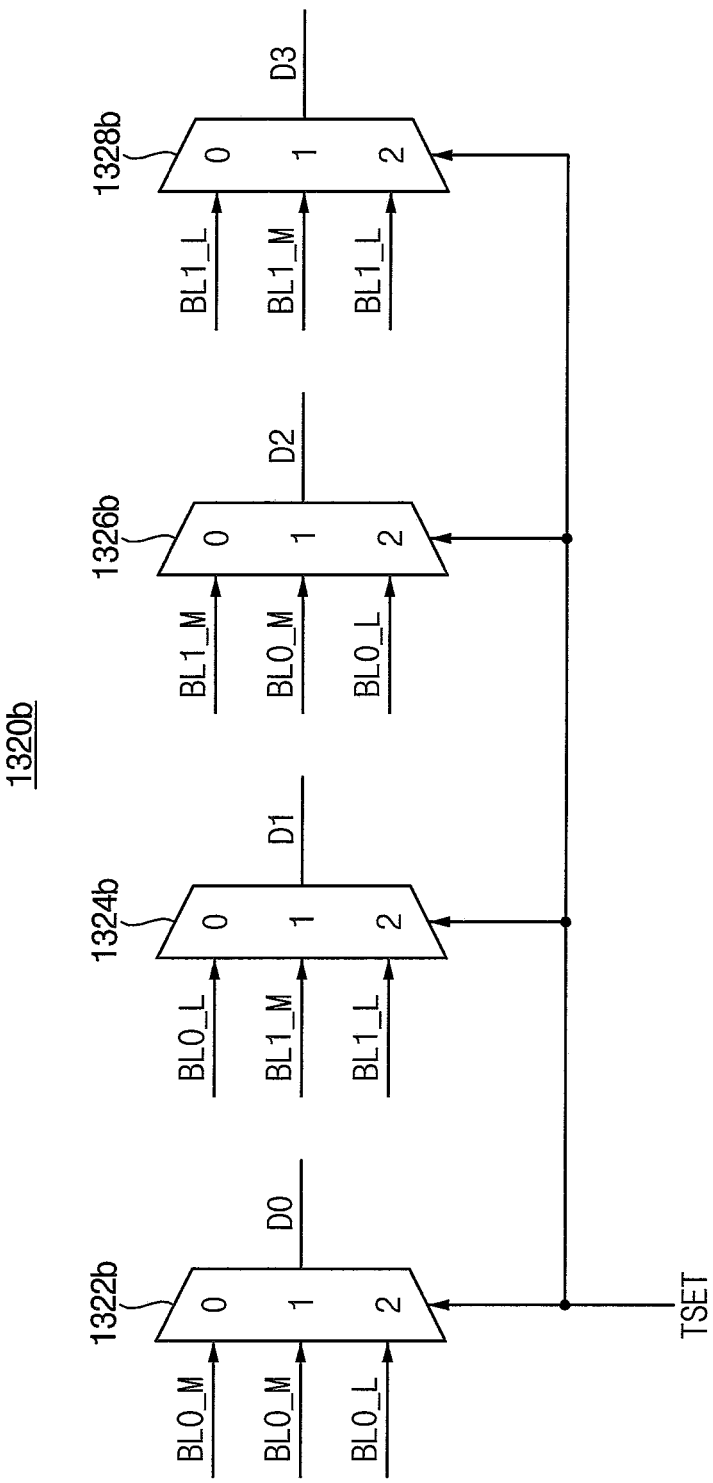
FIGS. 23 and 24 are block diagrams illustrating examples of a selecting circuit included in a memory device of FIG. 5.
Figure 24:
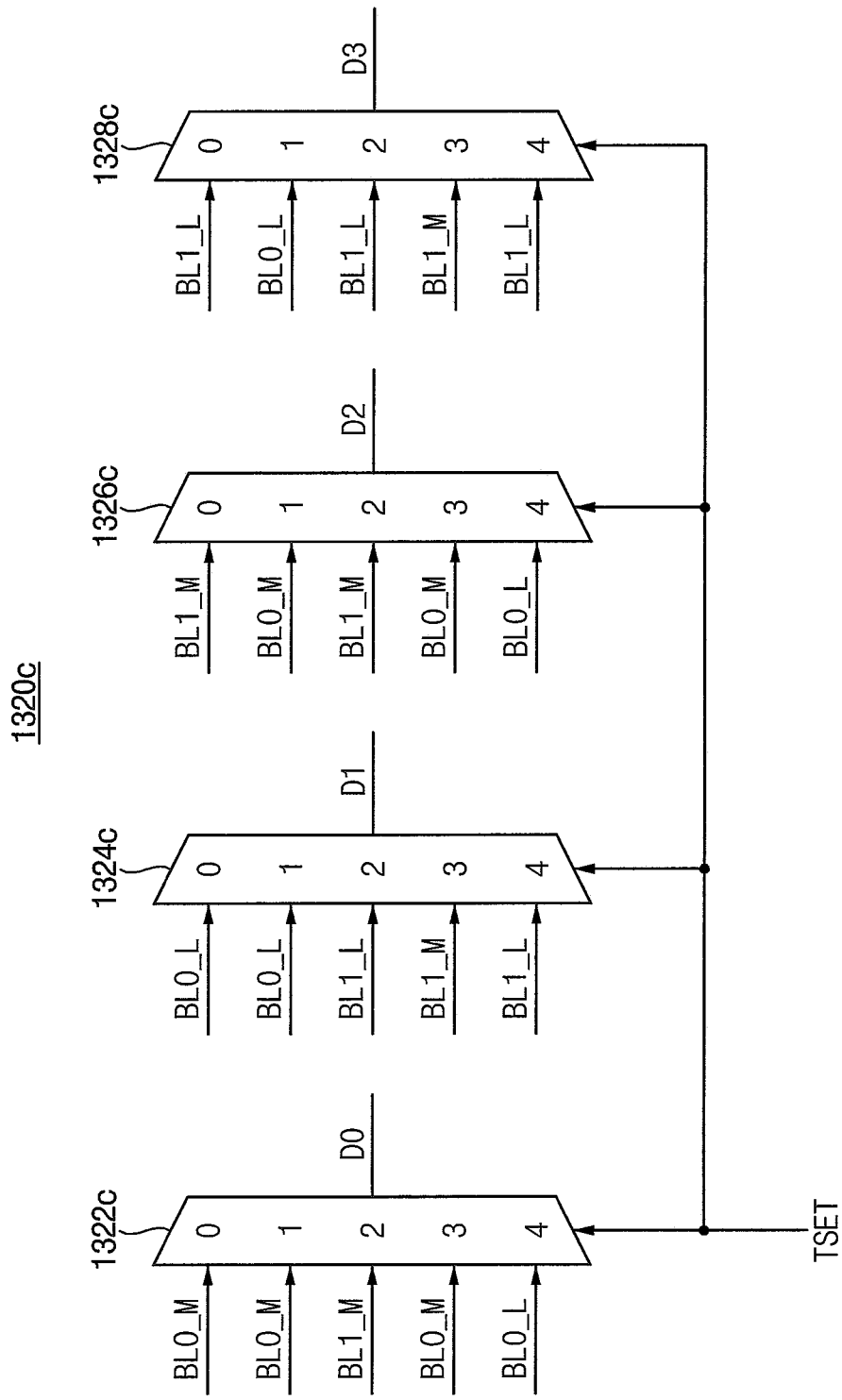

FIGS. 23 and 24 are block diagrams illustrating examples of a selecting circuit included in a memory device of FIG. 5.

Referring to FIG. 23, a selecting circuit 1320b may include a first multiplexer 1322b, a second multiplexer 1324b, a third multiplexer 1326b and a fourth multiplexer 1328b. FIG. 23 illustrates an example where the first test mode and the second test mode are the MSB mode and the LSB mode, respectively.

The first through fourth multiplexers 1322b, 1324b, 1326b and 1328b may operate based on the setting signal TSET. For example, when the setting signal TSET has a first value (e.g., '0'), the data bits BL0_M, BL0_L, BL1_M and BL1_L may be output to the lines D0, D1, D2 and D3, respectively, during the normal mode. When the setting signal TSET has a second value (e.g., '1'), the data bits BL0_M, BL1_M, BL0_M and BL1_M may be output to the lines D0, D1, D2 and D3, respectively, during the MSB mode. When the setting signal TSET has a third value (e.g., '2'), the data bits BL0_L, BL1_L, BL0_L and BL1_L may be output to the lines D0, D1, D2 and D3, respectively, during the LSB mode.

Referring to FIG. 24, a selecting circuit 1320c may include a first multiplexer 1322c, a second multiplexer 1324c, a third multiplexer 1326c and a fourth multiplexer 1328c. FIG. 24 illustrates an example where the examples of FIGS. 15 and 23 are combined. For example, when the setting signal TSET has a first value (e.g., '0'), a second value (e.g., '1'), a third value (e.g., '2'), a fourth value (e.g., '3') and a fifth value (e.g., '4'), the selecting circuit 1320c may operate in the normal mode, the even mode, the odd mode, the MSB mode and the LSB mode, respectively.

Although example embodiments are described based on the specific number of data and/or data bits, example embodiments are not limited thereto.

Figure 25:
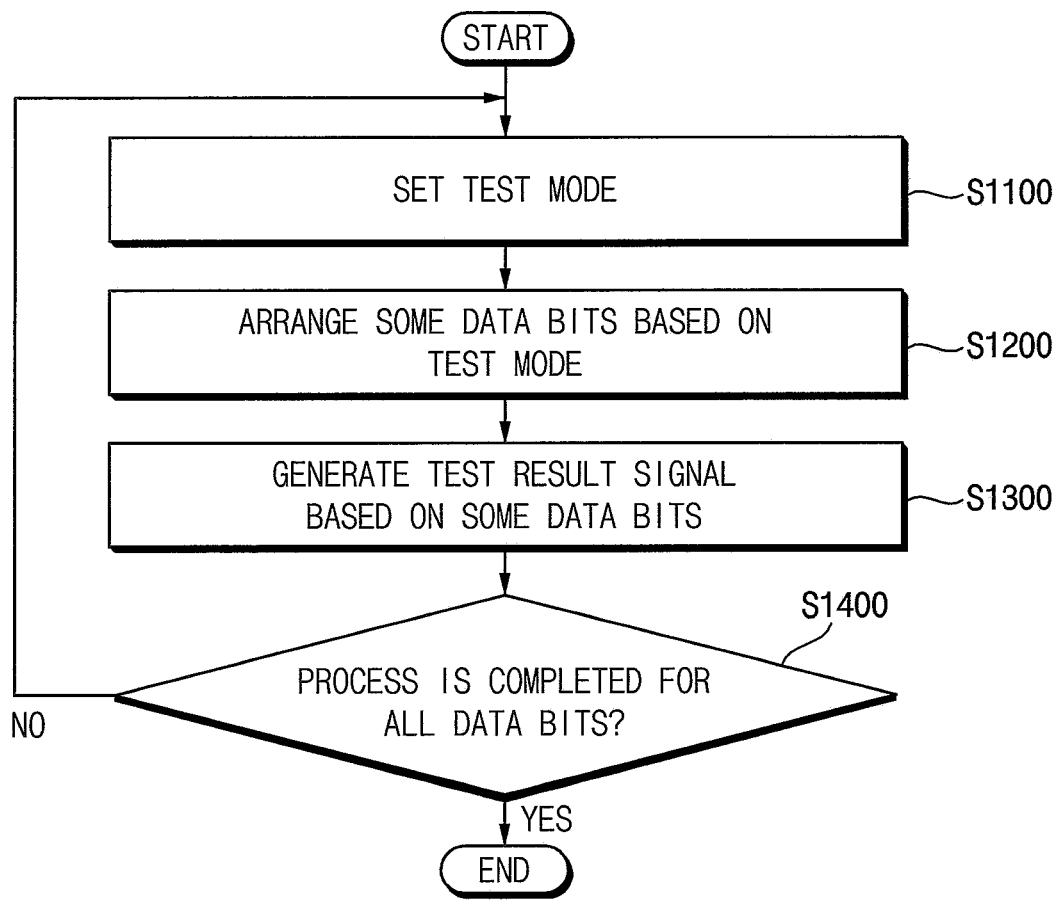
FIG. 25 is a flowchart illustrating a method of generating a signal for test according to example embodiments.

FIG. 25 is a flowchart illustrating a method of generating a signal for test according to example embodiments.

Referring to FIG. 25, a method of generating a signal for test is illustrated by generalizing the method of FIG. 1.

For example, in the method of generating the signal for test according to example embodiments, a test mode is set (step S1100), some data bits included in a plurality of test data and obtained by reading the plurality of test data are arranged based on the test mode or a specific scheme predetermined by the test mode (step S1200), and a test result signal is generated based on the some data bits arranged based on the specific scheme (step S1300). When steps S1100, S1200 and S1300 are not completed for all data bits included in the plurality of test data (step S1400: NO), the test mode and the arrangement scheme are changed, and steps S1100, S1200 and S1300 may be performed again. When steps S1100, S1200 and S1300 are completed for all data bits included in the plurality of test data (step S1400: YES), the process may be terminated.

For example, steps S100 and S400 in FIG. 1 may be included in step S1100, steps S200 and S500 in FIG. 1 may be included in step S1200, and steps S300 and S600 in FIG. 1 may be included in step S1300. For another example, steps S1100, S1200 and S1300 may be performed three times, respectively, in the PAM8 scheme.

Figure 26:
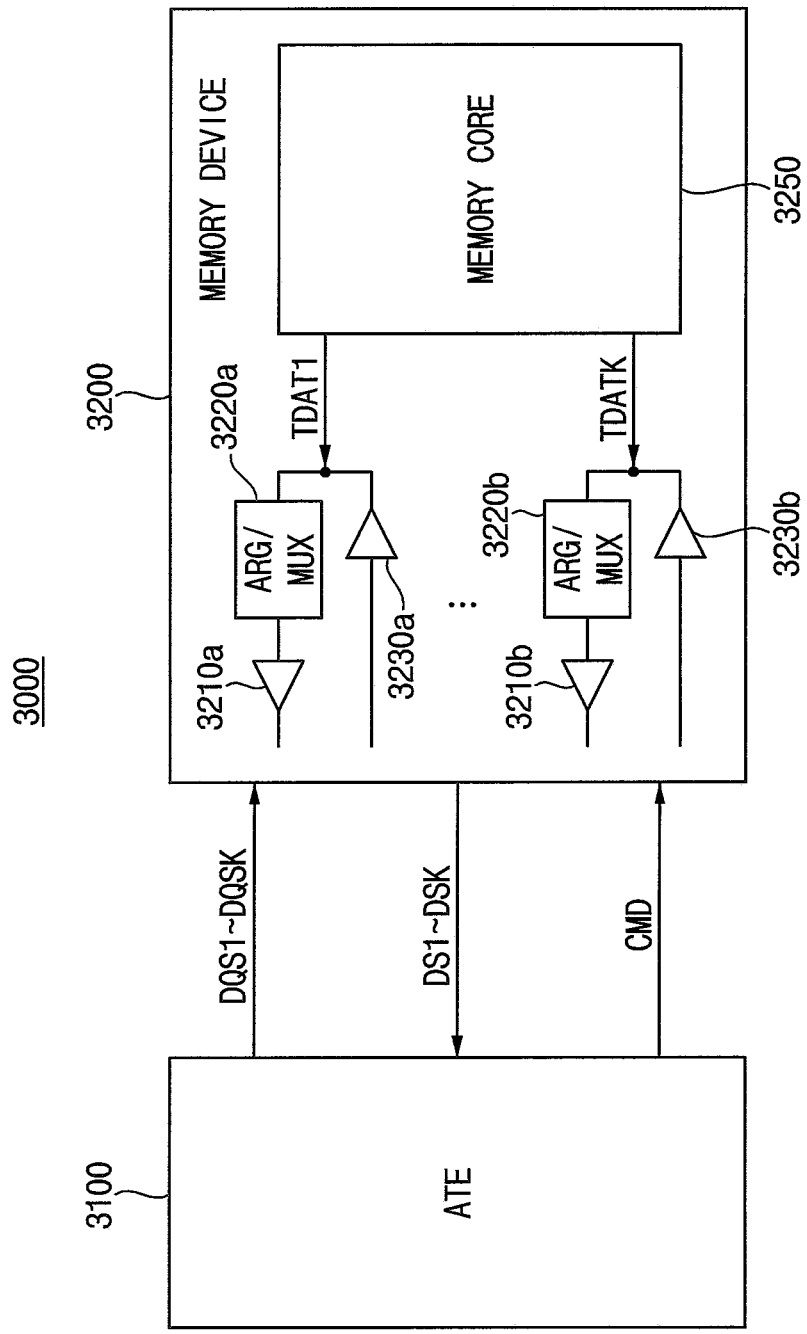
FIG. 26 is a block diagram illustrating a test system according to example embodiments.

FIG. 26 is a block diagram illustrating a test system according to example embodiments.

Referring to FIG. 26, a test system 3000 includes a test equipment 3100 and a memory device 3200.

The test equipment 3100 generates a plurality of data strobe signals DQS1 through DQSK and a command signal CMD, and receives a plurality of data signals DS1 through DSK from the memory device 3200. For example, the number of the data strobe signals DQS1 through DQSK and the number of the data signals DS1 through DSK may be K, where K is a natural number greater than or equal to two. The plurality of data signals DS1 through DSK may be two-level signals, and the test equipment 3100 may be an existing or conventional test equipment that generates two-level signals. For example, the test equipment 3100 may be an automated test equipment (ATE).

The plurality of data strobe signals DQS1 through DQSK, the plurality of data signals DS1 through DSK and the command signal CMD may correspond to the data strobe signal DQS in FIG. 5, the rest result signal TRS in FIG. 3 and the command signal CMD in FIG. 3, respectively. The plurality of data signals DS1 through DSK may correspond to test data provided from the test equipment 3100.

The memory device 3200 may include a plurality of transmitters 3210a and 3210b, a plurality of receivers 3230a and 3230b, a plurality of arranging and multiplexing circuits (ARG/MUX) 3220a and 3220b, and a memory core 3250. For example, the number of the transmitters 3210a and 3210b, the number of the receivers 3230a and 3230b and the number of the arranging and multiplexing circuits 3220a and 3220b may be K, which corresponds to the number of the data signals DS1 through DSK. The memory device 3200 may operate based on the multi-level signaling scheme that transmits and receives multi-level signals.

The plurality of transmitters 3210a and 3210b and the plurality of arranging and multiplexing circuits 3220a and 3220b may generate the plurality of data signals DS1 through DSK that are the two-level signals based on a plurality of test data TDAT1 through TDATK that are multi-bit data. The plurality of receivers 3230a and 3230b may receive multi-level signals. The memory core 3250 may output the plurality of test data TDAT1 through TDATK. In other words, the plurality of test data TDAT1 through TDATK may be provided from the memory core 3250 as read data.

The memory device 3200 may be the memory device according to example embodiments, and the plurality of transmitters 3210a and 3210b and the plurality of arranging and multiplexing circuits 3220a and 3220b may form the data arrangement circuit and the output circuit that are included in the memory device according to example embodiments.

Although FIG. 26 illustrates that the test equipment 3100 tests or inspects one memory device 3200, example embodiments are not limited thereto. For example, the test equipment 3100 may approximately simultaneously test a plurality of memory devices.

Although not illustrated in detail, the memory device 3200 may receive a plurality of input data signals corresponding to the plurality of test data TDAT1 through TDATK from the test equipment 3100, and the memory device 3200 may include a configuration for generating multi-bit data based on two-level signals.

FIG. 27 is a block diagram illustrating a memory system according to example embodiments.

Referring to FIG. 27, a memory system 10 includes a memory controller 20 and a memory device 40. The memory system 10 may further include a plurality of signal lines 30 that electrically connect the memory controller 20 with the memory device 40.

The memory device 40 is controlled by the memory controller 20. For example, based on requests from a host (not illustrated), the memory controller 20 may store (e.g., write or program) data into the memory device 40, or may retrieve (e.g., read or sense) data from the memory device 40. The memory device 40 may be the memory device according to example embodiments.

The plurality of signal lines 30 may include control lines, command lines, address lines, data input/output (I/O) lines and power lines. The memory controller 20 may transmit a command CMD, an address ADDR and a control signal CTRL to the memory device 40 via the command lines, the address lines and the control lines, may exchange a data signal MLDAT with the memory device 40 via the data I/O lines, and may transmit a power supply voltage PWR to the memory device 40 via the power lines. For example, the data signal MLDAT may be a multi-level signal. Although not illustrated in FIG. 27, the plurality of signal lines 30 may further include data strobe signal (DQS) lines for transmitting a data strobe signal.

In some example embodiments, at least a part or all of the signal lines 30 may be referred to as a channel. The term "channel" as used herein may represent signal lines that include the data I/O lines for transmitting the data signal MLDAT. However, example embodiments are not limited thereto, and the channel may further include the command lines for transmitting the command CMD and/or the address lines for transmitting the address ADDR.

Figure 28:
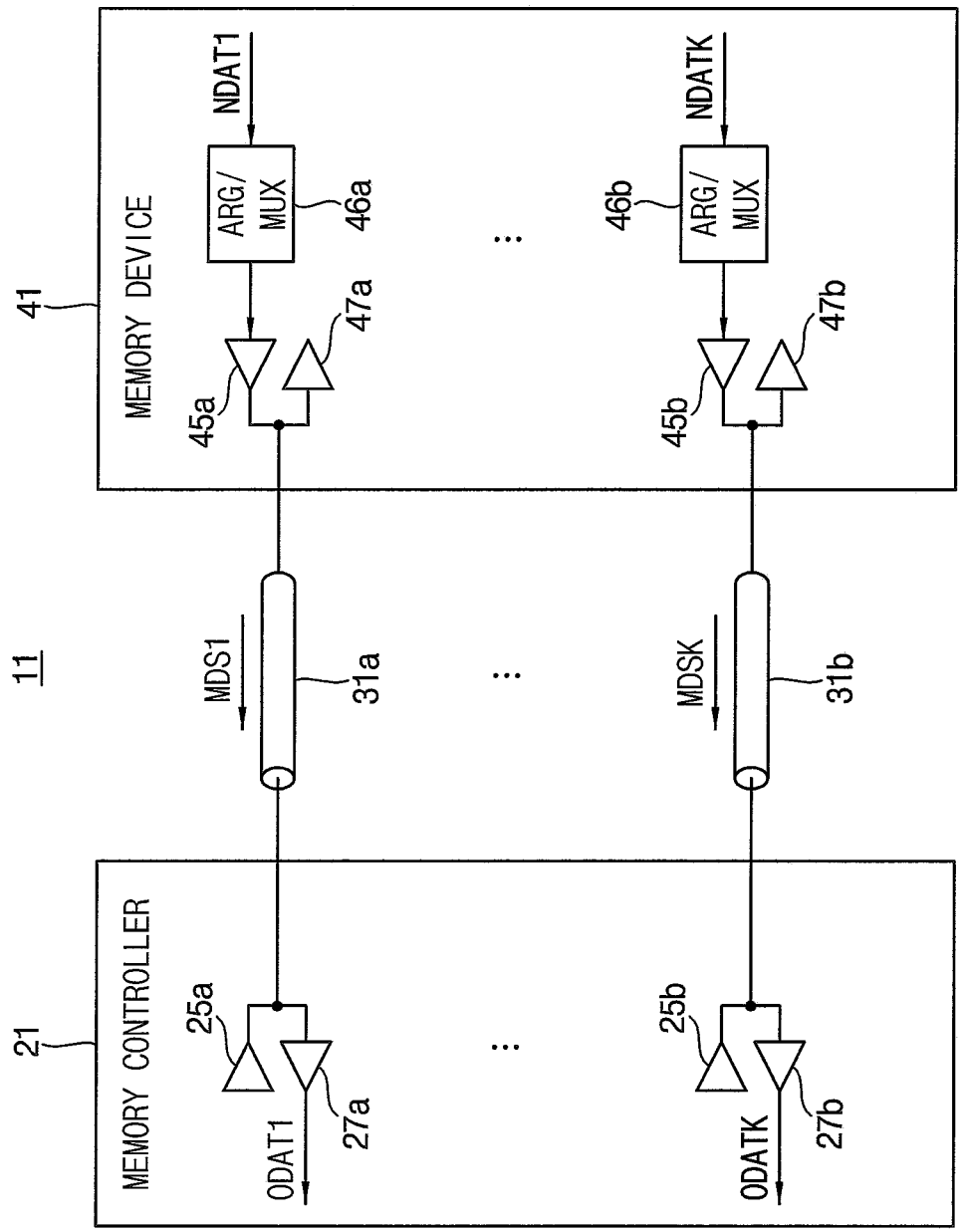
FIG. 28 is a block diagram illustrating an example of a memory system of FIG. 27.

FIG. 28 is a block diagram illustrating an example of a memory system of FIG. 27.

Referring to FIG. 28, a memory system 11 includes a memory controller 21, a memory device 41 and a plurality of channels 31a through 31b. For example, the number of the channels 31a through 31b may be K, where K is a natural number greater than or equal to two.

The memory controller 21 may include a plurality of transmitters 25a and 25b, and a plurality of receivers 27a and 27b. The memory device 41 may include a plurality of transmitters 45a and 45b, a plurality of receivers 47a and 47b, and a plurality of arranging and multiplexing circuits 46a and 46b. The memory device 41 may be the memory device according to example embodiments.

Each of the plurality of transmitters 25a, 25b, 45a and 45b may output or generate a multi-level signal. Each of the plurality of receivers 27a, 27b, 47a and 47b may receive the multi-level signal.

The plurality of channels 31a and 31b may connect the memory controller 21 with the memory device 41. Each of the plurality of channels 31a and 31b may be connected to a respective one of the plurality of transmitters 25a and 25b and a respective one of the plurality of receivers 27a and 27b. In addition, each of the plurality of channels 31a and 31b may be connected to a respective one of the plurality of transmitters 45a and 45b and a respective one of the plurality of receivers 47a and 47b. The multi-level signal may be transmitted through each of the plurality of channels 31a and 31b.

FIG. 28 illustrates an operation of transferring data from the memory device 41 to the memory controller 21. For example, the arranging and multiplexing circuit 46a and the transmitter 45a may generate a data signal MDS1, which is the multi-level signal, based on data NDAT1, the data signal MDS1 may be transmitted from the memory device 41 to the memory controller 21 through the channel 31a, and the receiver 27a may receive the data signal MDS1 to obtain data ODAT1 corresponding to the data NDAT1. Similarly, the arranging and multiplexing circuit 46b and the transmitter 45b may generate a data signal MDSK, which is the multi-level signal, based on input data NDATK, the data signal MDSK may be transmitted to the memory controller 21 through the channel 31b, and the receiver 27b may receive the data signal MDSK to obtain data ODATK corresponding to the data NDATK. For example, the data NDAT1 and NDATK may be read data retrieved from the memory device 41. FIG. 28 illustrates an operation in the normal mode, and the arranging and multiplexing circuits 46a and 46b may operate as described with reference to FIGS. 14A and 14B.

Figure 29:
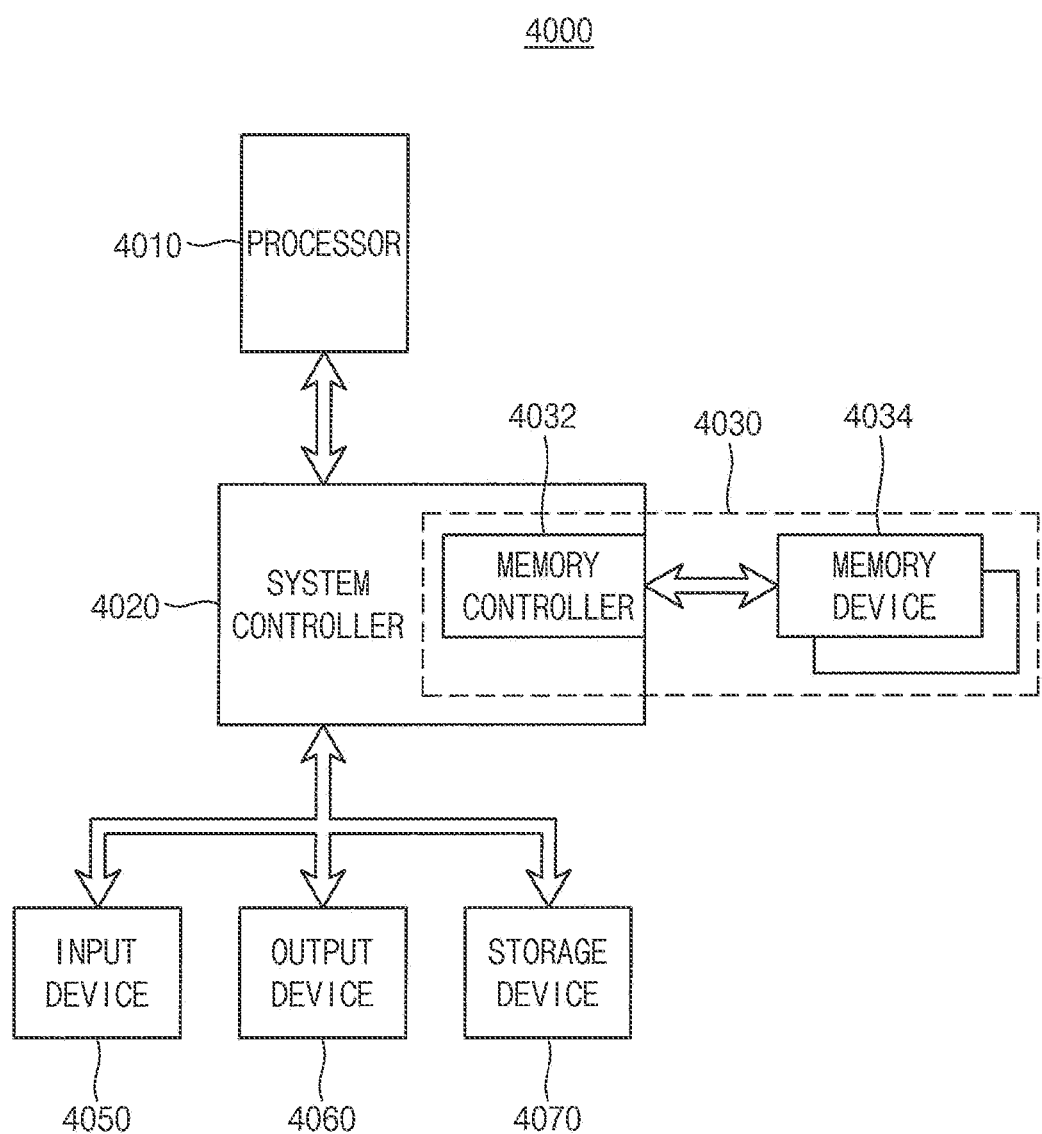
FIG. 29 is a block diagram illustrating a computing system according to example embodiments.

FIG. 29 is a block diagram illustrating a computing system according to example embodiments.

Referring to FIG. 29, a computing system 4000 includes a processor 4010, a system controller 4020 and a memory system 4030. The computing system 4000 may further include an input device 4050, an output device 4060 and a storage device 4070.

The memory system 4030 includes a plurality of memory devices 4034, and a memory controller 4032 for controlling the memory devices 4034. The memory controller 4032 may be included in the system controller 4020. The memory system 4030 may be the memory system according to example embodiments, and may include the memory device according to example embodiments.

The processor 4010 may perform various computing functions, such as executing specific software instructions for performing specific calculations or tasks. The processor 4010 may be connected to the system controller 4020 via a processor bus. The system controller 4020 may be connected to the input device 4050, the output device 4060 and the storage device 4070 via an expansion bus. As such, the processor 4010 may control the input device 4050, the output device 4060 and the storage device 4070 using the system controller 4020.

The inventive concept may be applied to various electronic devices and systems that include the glitch detectors and the security devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of generating a signal for test in a memory device, wherein the memory device is configured to output a multi-level signal having three or more voltage levels that are different from each other, the method comprising:
setting an operation mode of the memory device to a first test mode based on a command signal;
during the first test mode, arranging first data bits included in a plurality of test data based on a first scheme, wherein the first data bits are obtained by reading the plurality of test data stored in the memory device, and wherein each of the plurality of test data comprises two or more data bits;
during the first test mode, generating a first test result signal based on the first data bits according to the first scheme, wherein the first test result signal has two voltage levels that are different from each other;
setting the operation mode to a second test mode based on the command signal, wherein the second test mode is different from the first test mode;
during the second test mode, arranging second data bits included in the plurality of test data based on a second scheme that is different from the first scheme, wherein the second data bits are different from the first data bits and are obtained by reading the plurality of test data; and
during the second test mode, generating a second test result signal based on the second data bits according to the second scheme, wherein the second test result signal has the two voltage levels that are different from each other,
wherein the first test mode causes the memory device to sequentially output data bits included in even-numbered test data among the plurality of test data, and
wherein the arranging the first data bits based on the first scheme comprises:
reading the plurality of test data in parallel;
performing a first arrangement operation such that first most significant bits (MSBs) and first least significant bits (LSBs) included in first even-numbered test data among the even-numbered test data are alternately arranged with respect to one another; and
performing a second arrangement operation such that second MSBs and second LSBs included in second even-numbered test data among the even-numbered test data are alternately arranged with respect to one another.

2. The method of claim 1,
wherein each of the plurality of test data includes two data bits that are different from each other, and
wherein the three or more voltage levels that are different from each other comprise a first voltage level, a second voltage level, a third voltage level, and a fourth voltage level.

3. The method of claim 2,
wherein the two voltage levels that are different from each other comprise the first voltage level and the fourth voltage level,
wherein the first voltage level is a lowest voltage level among the first, second, third and fourth voltage levels, and
wherein the fourth voltage level is a highest voltage level among the first, second, third and fourth voltage levels.

4. The method of claim 1,
wherein the second test mode causes the memory device to sequentially output data bits included in odd-numbered test data among the plurality of test data.

5. The method of claim 1, wherein generating the first test result signal comprises:
generating a first output value included in the first test result signal based on the first MSBs;
generating a second output value included in the first test result signal based on the first LSBs;
generating a third output value included in the first test result signal based on the second MSBs; and
generating a fourth output value included in the first test result signal based on the second LSBs.

6. The method of claim 5,
wherein when the first and second arrangement operations are performed, the first MSBs and the first LSBs that are alternately arranged with respect to one another are provided in parallel to generate the first test result signal, and then the second MSBs and the second LSBs that are alternately arranged with respect to one another are provided in parallel to generate the first test result signal, and
wherein when the first test result signal is generated, the first, second, third and fourth output values are sequentially generated.

7. The method of claim 4, wherein arranging the second data bits based on the second scheme comprises:
performing a third arrangement operation such that third MSBs and third LSBs included in first odd-numbered test data among the plurality of odd-numbered test data are alternately arranged with respect to one another; and performing a fourth arrangement operation such that fourth MSBs and fourth LSBs included in second odd-numbered test data among the plurality of odd-numbered test data are alternately arranged with respect to one another.

8. The method of claim 7, wherein generating the second test result signal comprises:
generating a fifth output value included in the second test result signal based on the third MSBs;
generating a sixth output value included in the second test result signal based on the third LSBs;
generating a seventh output value included in the second test result signal based on the fourth MSBs; and
generating an eighth output value included in the second test result signal based on the fourth LSBs.

9. The method of claim 1,
wherein the first test mode is a test mode in which most significant bits (MSBs) included in the plurality of test data are sequentially output, and
wherein the second test mode is a test mode in which least significant bits (LSBs) included in the plurality of test data are sequentially output.

10. The method of claim 9, wherein arranging the first data bits based on the first scheme comprises:
reading the plurality of test data in parallel;
performing a first arrangement operation such that first MSBs included in first test data among the plurality of test data and second MSBs included in second test data among the plurality of test data are alternately arranged with respect to one another; and
performing a second arrangement operation such that third MSBs included in third test data among the plurality of test data and fourth MSBs included in fourth test data among the plurality of test data are alternately arranged with respect to one another.

11. The method of claim 10, wherein generating the first test result signal comprises:
generating a first output value included in the first test result signal based on the first MSBs;
generating a second output value included in the first test result signal based on the second MSBs;
generating a third output value included in the first test result signal based on the third MSBs; and
generating a fourth output value included in the first test result signal based on the fourth MSBs.

12. The method of claim 10, wherein arranging the second data bits based on the second scheme comprises:
performing a third arrangement operation such that first LSBs included in the first test data and second LSBs included in the second test data are alternately arranged with respect to one another; and
performing a fourth arrangement operation such that third LSBs included in the third test data and fourth LSBs included in the fourth test data are alternately arranged with respect to one another.

13. The method of claim 12, wherein generating the second test result signal comprises:
generating a fifth output value included in the second test result signal based on the first LSBs;
generating a sixth output value included in the second test result signal based on the second LSBs;
generating a seventh output value included in the second test result signal based on the third LSBs; and
generating an eighth output value included in the second test result signal based on the fourth LSBs.

14. A memory device configured to output a multi-level signal having three or more voltage levels that are different from each other, comprising:
a memory core configured to store a plurality of test data, wherein each of the plurality of test data comprises two or more data bits;
a memory register set configured to set an operation mode of the memory device to one of a first test mode or a second test mode based on a command signal, wherein the first and second test modes are different from each other;
a data arrangement circuit configured to arrange first data bits included in the plurality of test data based on a first scheme during the first test mode, and to arrange second data bits included in the plurality of test data based on a second scheme during the second test mode, wherein the first and second data bits are different from each other and are obtained by reading the plurality of test data, and wherein the first and second schemes are different from each other; and
an output circuit configured to generate a first test result signal based on the first data bits according to the first scheme during the first test mode, and to generate a second test result signal based on the second data according to the second scheme during the second test mode, wherein each of the first and second test result signals have two voltage levels that are different from each other,
wherein the data arrangement circuit comprises a selecting circuit configured to output the first data bits arranged based on the first scheme, and to output the second data bits arranged based on the second scheme, and
wherein the selecting circuit comprises:
a first multiplexer configured to output a first most significant bit (MSB) included in first test data among the plurality of test data during the first test mode, and to output a first least significant bit (LSB) included in the first test data during the second test mode;
a second multiplexer configured to output a second MSB included in second test data among the plurality of test data during the first test mode, and to output a second LSB included in the second test data during the second test mode;
a third multiplexer configured to output the first MSB during the first test mode, and to output the first LSB during the second test mode; and
a fourth multiplexer configured to output the second MSB during the first test mode, and to output the second LSB during the second test mode.

15. The memory device of claim 14, wherein the data arrangement circuit comprises:
an ordering circuit configured to change an arrangement order of the plurality of test data that are read in parallel; and
wherein the selecting circuit is configured to output the first data bits and the second data bits based on an output of the ordering circuit.

16. The memory device of claim 14,
wherein the memory core is configured to store a plurality of normal data, wherein each of the plurality of normal data comprises two or more data bits, wherein the memory register set is configured to set the operation mode to a normal mode based on the command signal, wherein the data arrangement circuit is configured to arrange the plurality of normal data based on a third scheme different from the first and second schemes during the normal mode, and wherein the output circuit is configured to generate the multi-level signal based on an output of the data arrangement circuit during the normal mode.

17. A method of generating a signal for test in a memory device, wherein the memory device is configured to output a pulse amplitude modulation four (PAM4) signal having four voltage levels that are different from each other, the method comprising:

setting an operation mode of the memory device to a first test mode based on a command signal;

during the first test mode, reading a plurality of test data stored in the memory device, wherein each of the plurality of test data comprises two or more data bits;

during the first test mode, alternately arranging most significant bits (MSBs) included in the plurality of test data or data bits included in even-numbered test data among the plurality of test data based on a first scheme;

during the first test mode, generating a first test result signal based on the MSBs of the plurality of test data or the data bits of the even-numbered test data that are alternately arranged based on the first scheme, wherein the first test result signal comprises two voltage levels that are different from each other;

setting the operation mode to a second test mode based on the command signal, wherein the second test mode is different from the first test mode;

during the second test mode, reading the plurality of test data;

during the second test mode, alternately arranging least significant bits (LSBs) included in the plurality of test data or data bits included in odd-numbered test data among the plurality of test data based on a second scheme different from the first scheme; and during the second test mode, generating a second test result signal based on the LSBs of the plurality of test data or the data bits of the odd-numbered test data that are alternately arranged based on the second scheme, wherein the second test result signal comprises the two voltage levels that are different from each other, and wherein the first and second test result signals collectively comprise information of all data bits included in the plurality of test data.

* * * * *